(12) United States Patent
Yamada et al.

(10) Patent No.: US 12,581,220 B2
(45) Date of Patent: Mar. 17, 2026

(54) IMAGING DEVICE HAVING INSULATED AMPLIFICATION TRANSISTOR

(71) Applicant: SONY SEMICONDUCTOR SOLUTIONS CORPORATION, Kanagawa (JP)

(72) Inventors: Kyosuke Yamada, Kanagawa (JP); Atsuhiko Yamamoto, Kanagawa (JP); Takashi Machida, Tokyo (JP); Hideo Kido, Kanagawa (JP); Ryo Fukui, Kanagawa (JP); Yu Shiihara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/001,299

(22) PCT Filed: May 17, 2021

(86) PCT No.: PCT/JP2021/018655
§ 371 (c)(1),
(2) Date: Dec. 9, 2022

(87) PCT Pub. No.: WO2021/256142
PCT Pub. Date: Dec. 23, 2021

(65) Prior Publication Data
US 2023/0254608 A1     Aug. 10, 2023

(30) Foreign Application Priority Data
Jun. 16, 2020     (JP) ................................. 2020-103558

(51) Int. Cl.
*H04N 25/78* (2023.01)
*H10F 39/00* (2025.01)

(52) U.S. Cl.
CPC .......... *H04N 25/78* (2023.01); *H10F 39/802* (2025.01); *H10F 39/8037* (2025.01); *H10F 39/811* (2025.01)

(58) Field of Classification Search
CPC .............. H04N 25/78; H01L 27/14603; H01L 27/14612; H01L 27/14636;
(Continued)

(56) References Cited

U.S. PATENT DOCUMENTS

2011/0155893 A1* 6/2011 Endo .................... H04N 25/767
257/292
2015/0129943 A1 5/2015 Kato et al.
(Continued)

FOREIGN PATENT DOCUMENTS

| | | |
|---|---|---|
| JP | 2014-022561 | 2/2014 |
| JP | 2015-095468 | 5/2015 |

(Continued)

OTHER PUBLICATIONS

International Search Report and Written Opinion prepared by the Japan Patent Office on Jul. 19, 2021, for International Application No. PCT/JP2021/018655, 3 pgs.

*Primary Examiner* — Thanh Luu
*Assistant Examiner* — Mai Thi Ngoc Tran
(74) *Attorney, Agent, or Firm* — SHERIDAN ROSS P.C.

(57) ABSTRACT

Provided is an imaging device capable of suppressing deterioration in characteristics. The imaging device includes a first substrate portion and a second substrate portion on one surface side of the first substrate portion. The first substrate portion includes a sensor pixel, a first interlayer insulating film, and a first electrode portion. The second substrate portion includes a readout circuit, a second interlayer insulating film, and a second electrode portion. The first electrode portion and the second electrode portion are directly (Continued)

joined to each other. The second semiconductor substrate includes a first element region in which an amplification transistor is provided, a second element region in which another element is provided, and a through region through which the second semiconductor substrate passes in the thickness direction. The first element region and the second element region are isolated by the through region.

20 Claims, 24 Drawing Sheets

(58) Field of Classification Search
CPC ......... H01L 27/14621; H01L 27/14627; H01L 27/1463; H01L 27/14634; H01L 21/8234; H01L 27/06; H01L 27/088; H01L 27/146; H01L 27/1464; H01L 27/14641; H01L 27/14643; H01L 27/1469; H10F 39/813; H10F 39/802; H10F 39/8037; H10F 39/811; H10F 39/018; H10F 39/12; H10F 39/18; H10F 39/199; H10F 39/8053; H10F 39/8063; H10F 39/807; H10F 39/809; H10D 84/00; H10D 84/0126; H10D 84/038; H10D 84/83
USPC ..................................... 205/208.1; 250/208.1
See application file for complete search history.

(56) References Cited

U.S. PATENT DOCUMENTS

| | | | |
|---|---|---|---|
| 2015/0179691 A1 | 6/2015 | Yanagita et al. | |
| 2017/0062499 A1* | 3/2017 | Yanagita | H01L 27/14641 |
| 2018/0152657 A1* | 5/2018 | Miyazawa | H10F 39/018 |
| 2019/0313045 A1* | 10/2019 | Sakakibara | H03K 5/2481 |
| 2019/0319071 A1* | 10/2019 | Hirose | H01L 21/768 |

FOREIGN PATENT DOCUMENTS

| | | |
|---|---|---|
| WO | WO 2011/077580 | 4/2009 |
| WO | WO 2016/009832 | 1/2016 |
| WO | WO 2018/016570 | 1/2018 |
| WO | WO 2019/131965 | 4/2019 |

* cited by examiner

1

RB       RA

ML
102      CF

11

PD        PD
10   TG        TG
FD        FD
FL1      DL    VL

101        FL1
DL        M11 (HL)
         M12 (HL)
JB21 { E11      DL
      E21      E11 } JA12
         E21

203         202   VL
21          FL2

DL        AMP
         M21 (HL)
20   AMP      M22 (HL)
         M23 (HL)
201        M24 (HL)

M25 (HL)
JB23 { E22
      E31      E22 } JA23
         E31
DL        M33 (HL)
30          M32 (HL)
301       M31 (HL)

31

Z
X

1A

| RB | RA |
|---|---|

102 — ML

CF

PD

11 — PD

TG

10 — TG

FD

FL1 — FD

101 — DL

DL — FL1

M11 (HL)

M12 (HL)

J821 { E11 / E21 — VL

DL

203 — E11 / E21 } JA12

M21 (HL)

AMP — M22 (HL)

DL — VL

FL2

21 — AMP

20 — 202

201 — M23 (HL)

M24 (HL)

M25 (HL)

JB23 { E22 / E31

E22 / E31 } JA23

DL

301 — M33 (HL)

M32 (HL)

30 — M31 (HL)

DL

31

Z
↑
→ X

IMAGING DEVICE HAVING INSULATED AMPLIFICATION TRANSISTOR

CROSS REFERENCE TO RELATED APPLICATIONS

This application is a national stage application under 35 U.S.C. 371 and claims the benefit of PCT Application No. PCT/JP2021/018655, having an international filing date of 17 May 2021, which designated the United States, which PCT application claimed the benefit of Japanese Patent Application No. 2020-103558, filed 16 Jun. 2020, the entire disclosures of each of which are incorporated herein by reference.

TECHNICAL FIELD

The present disclosure relates to an imaging device.

BACKGROUND ART

As a complementary metal oxide semiconductor (CMOS) image sensor, a structure in which a pixel circuit is arranged in two layers of an upper substrate and an intermediate substrate and a logic circuit is arranged in one layer of a lower substrate is known (see, for example, Patent Document 1). Furthermore, there is known a solid-state imaging device having a structure including a first semiconductor substrate at which a photodiode and a floating diffusion are formed and a second semiconductor substrate at which an amplification transistor is formed, in which electrodes are joined to each other at a joint surface between a first semiconductor substrate and a second semiconductor substrate (see, for example, Patent Document 2).

CITATION LIST

Patent Document

Patent Document 1: International Publication WO 2016/009832
Patent Document 2: Japanese Patent Application Laid-Open No. 2014-22561

SUMMARY OF THE INVENTION

Problems to be Solved by the Invention

For example, in a CMOS image sensor having a small number of pixels to be shared or an imaging device having a memory (MEM) unit in a pixel circuit, there are many transistors and MOS gate structures to be arranged in the pixels. For this reason, as miniaturization and densification of sensor pixels progress, it becomes difficult to sufficiently secure the area of the amplification transistor, so that there is a possibility of deterioration of characteristics of the imaging device, such as an increase in noise and a decrease in conversion efficiency.

The present disclosure has been made in view of such circumstances, and an object thereof is to provide an imaging device capable of suppressing deterioration in characteristics.

Solutions to Problems

An imaging device according to an aspect of the present disclosure includes a first substrate portion and a second substrate portion provided on one surface side of the first substrate portion. The first substrate portion includes: a first semiconductor substrate; a sensor pixel provided at the first semiconductor substrate, the sensor pixel configured to perform photoelectric conversion; a first interlayer insulating film provided at the first semiconductor substrate on a side of a surface facing the second substrate portion; and a first electrode portion provided at the first interlayer insulating film on a side of a surface facing the second substrate portion. The second substrate portion includes: a second semiconductor substrate; a readout circuit provided at the second semiconductor substrate, the readout circuit configured to output a pixel signal based on a charge output from the sensor pixel; a second interlayer insulating film provided at the second semiconductor substrate on a side of a surface facing the first substrate portion; and a second electrode portion provided at the second interlayer insulating film on a side of a surface facing the first substrate portion. The first electrode portion and the second electrode portion are directly joined to each other. The readout circuit includes an amplification transistor configured to amplify a signal of a voltage corresponding to the level of the charge output from the sensor pixel. The second semiconductor substrate includes: a first element region in which the amplification transistor is provided; a second element region in which another element other than the amplification transistor is provided; and a through region through which the second semiconductor substrate passes in a thickness direction. The first element region and the second element region are isolated by the through region.

With such a configuration, the amplification transistor can easily secure a wide area to be arranged in a stacked manner with respect to the sensor pixel, and can suppress an increase in noise. Furthermore, since the amplification transistor is insulated and isolated from the another element by the through region, the amplification transistor can be a source follower type in which the source region and the well region are connected. Therefore, the amplification transistor can increase the gain, and the conversion efficiency can be improved. As a result, the imaging device can suppress deterioration in characteristics.

MODE FOR CARRYING OUT THE INVENTION

Hereinafter, embodiments of the present disclosure will be described with reference to the drawings. In the description of the drawings referred to in the following description, the same or similar parts are denoted by the same or similar signs. However, it should be noted that the drawings are schematic, and the relationship between the thickness and the plane dimension, the ratio of the thickness of each layer, and the like are different from the actual ones. Therefore, the specific thicknesses and dimensions should be determined in consideration of the following description. Furthermore, it goes without saying that parts for which the dimensional relationship therebetween and the ratio thereof are different among the drawings.

The definition of directions such as up and down in the following description is merely for convenience of explanation, and does not limit the technical idea of the present disclosure. For example, where the object is rotated by 90° and observed, the top and bottom are read as converted to left and right, and where the object is rotated by 180° and observed, the top and bottom are read as reversed, as a matter of course.

Furthermore, the following description includes a case where a direction is described using the terms X-axis direction, Y-axis direction, and Z-axis direction. For example, the X-axis direction and the Y-axis direction are directions that are parallel to each of main surfaces (front surface and back surface) of a first semiconductor substrate 11, a second semiconductor substrate 21, and a third semiconductor substrate 31. The X-axis direction and the Y-axis direction are also referred to as horizontal directions. The Z-axis direction is a direction vertically intersecting the horizontal direction. The X-axis direction, the Y-axis direction, and the Z-axis direction are orthogonal to one another.

First Embodiment

Configuration Example

Figure 1:
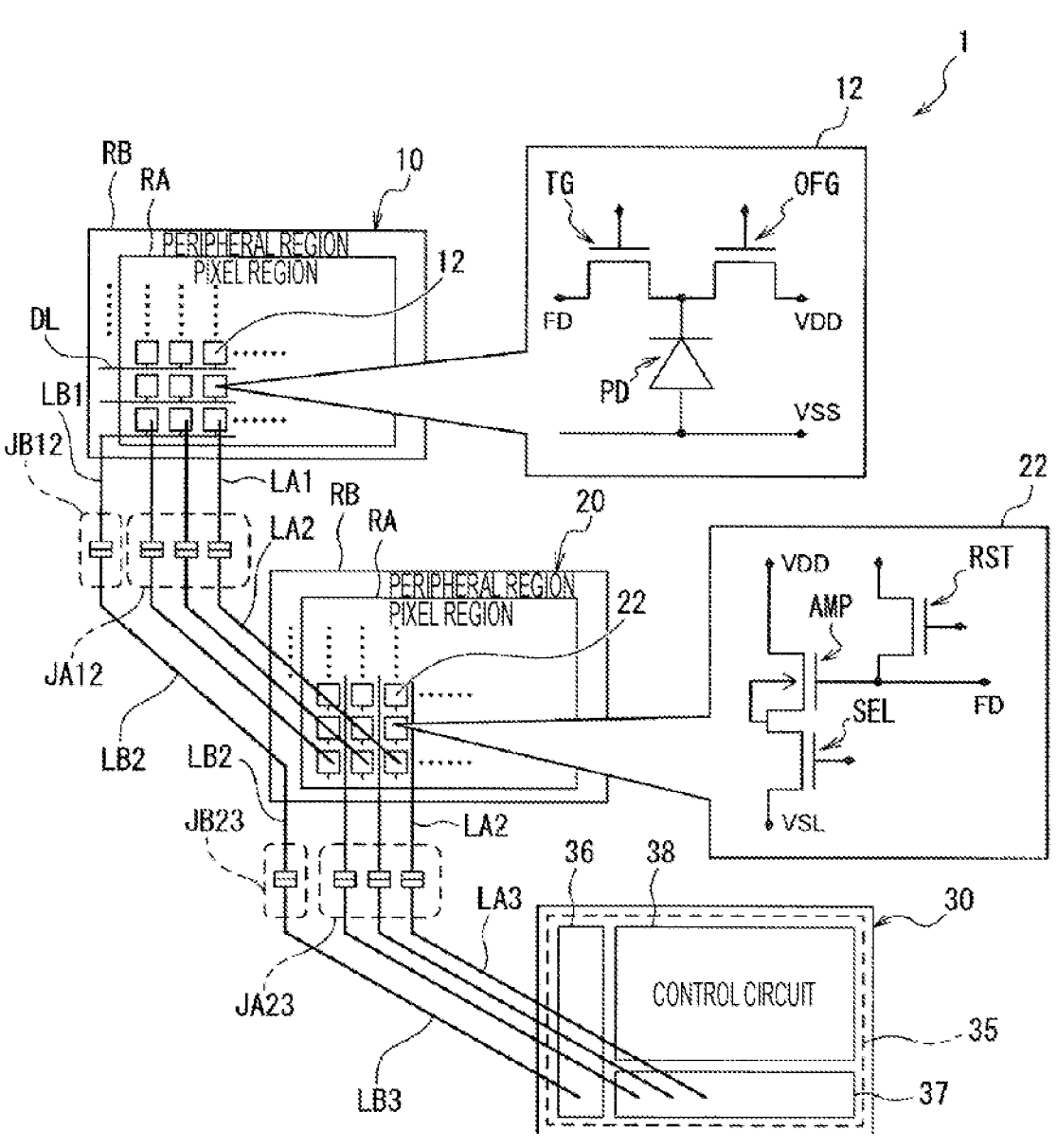
FIG. 1 is a schematic diagram illustrating a configuration example of an imaging device according to a first embodiment of the present disclosure.

FIG. 1 is a schematic diagram illustrating a configuration example of an imaging device 1 according to a first embodiment of the present disclosure. As illustrated in FIG. 1, the imaging device 1 is an imaging device having a three-layer stacked structure configured by bonding a first substrate portion 10, a second substrate portion 20, and a third substrate portion 30. The first substrate portion 10, the second substrate portion 20, and the third substrate portion 30 are stacked in this order.

The first substrate portion 10 includes a plurality of sensor pixels 12 that perform photoelectric conversion. The plurality of sensor pixels 12 is provided in a matrix in a pixel region RA in the first substrate portion 10. The sensor pixel 12 includes a photodiode PD (an example of a "photoelectric conversion element" of the present disclosure), a transfer transistor TG, a floating diffusion FD, and an overflow transistor OFG.

The photodiode PD is a photoelectric conversion unit that converts incident light into a charge by photoelectric conversion and stores the charge. In the photodiode PD, an anode terminal is grounded and a cathode terminal is connected to the transfer transistor TG and the overflow transistor OFG. The transfer transistor TG is driven in accordance with a drive signal supplied from a drive circuit 36 described later. When the transfer transistor TG is turned on, the charge stored in the photodiode PD is transferred to the floating diffusion FD. The floating diffusion FD is a floating diffusion region having a predetermined storage capacitance, and temporarily stores the charge transferred from the photodiode PD. The floating diffusion FD is connected to a gate electrode of an amplification transistor AMP described later. The overflow transistor OFG is driven in accordance with a drive signal supplied from the drive circuit 36 described later. When the overflow transistor OFG is turned on, the charge remaining in the photodiode PD in the initial state is discharged to a power supply line VDD.

A drive wiring line DL that drives the transfer transistor TG and the overflow transistor OFG is drawn from the pixel region RA of the first substrate portion 10 to a peripheral region RB positioned at the periphery of the pixel region RA. Furthermore, the drive wiring line DL is connected to the drive circuit 36 of the third substrate portion 30 via wiring lines LB1 to LB3 provided in the peripheral region RB and electrode junction portions JB12 and JB23 provided in the peripheral region RB.

Each of the wiring lines LB1 to LB3 includes a portion extending in the thickness direction of the substrate (for example, in the Z-axis direction). Furthermore, each of the wiring lines LB1 to LB3 may include a portion extending in a horizontal direction orthogonal to the thickness direction of the substrate (for example, in the X-axis direction and the Y-axis direction). The wiring line LB1 is a wiring line provided in the peripheral region RB of the first substrate portion 10, the wiring line LB2 is a wiring line provided in the peripheral region RB of the second substrate portion 20, and the wiring line LB3 is a wiring line provided in the peripheral region RB of the third substrate portion 30.

Each of the electrode junction portions JB12 and JB23 is a junction body in which two electrode portions including, for example, copper (Cu) or a Cu alloy containing Cu as a main component are joined to each other in the thickness direction of the substrate. The electrode junction portion JB12 connects the wiring lines LB1 and LB2 together between the first substrate portion 10 and the second substrate portion 20. The electrode junction portion JB23 connects the wiring lines LB2 and LB3 together between the second substrate portion 20 and the third substrate portion 30.

The floating diffusion FD provided in the first substrate portion 10, and the power supply line VDD and a reference potential line VSS (as an example, a ground potential line GND) provided at the first substrate portion are connected to a readout circuit 22 as described later of the second substrate portion 20 via wiring lines LA1 and LA2 provided in the pixel region RA, and an electrode junction portion JA12 provided in the pixel region RA.

Each of the wiring lines LA1 and LA2 and a wiring line LA3 that is described later includes a portion extending in the thickness direction of the substrate (for example, in the Z-axis direction). Furthermore, each of the wiring lines LA1 to LA3 may include a portion extending in a horizontal direction of the substrate (for example, in the X-axis direction and the Y-axis direction). The wiring line LA1 is a wiring line provided in the pixel region RA of the first substrate portion 10, the wiring line LA2 is a wiring line provided in the pixel region RA of the second substrate portion 20, and the wiring line LA3 is a wiring line provided in the pixel region RA of the third substrate portion 30.

Each of the electrode junction portion JA12 and an electrode junction portion JA23 that is provided in the pixel region RA and described later is a junction body in which two electrode portions including, for example, Cu or a Cu alloy are joined to each other in the thickness direction of the substrate. The electrode junction portion JA12 connects the wiring lines LA1 and LA2 together between the first substrate portion 10 and the second substrate portion 20. The electrode junction portion JA23 connects the wiring lines LA2 and LA3 together between the second substrate portion 20 and the third substrate portion 30.

The second substrate portion 20 includes the readout circuit 22 that outputs a pixel signal based on a charge output from the sensor pixel 12. The readout circuit 22 is provided in a matrix in the pixel region RA in the second substrate portion 20. One readout circuit 22 may be provided for each one of the sensor pixels 12, or may be provided for each plurality of (for example, two or four) sensor pixels 12. The second substrate portion 20 includes a plurality of pixel drive lines extending in the row direction and a plurality of vertical signal lines VSL extending in the column direction.

The readout circuit 22 includes the amplification transistor AMP, a selection transistor SEL, and a reset transistor RST. The amplification transistor AMP outputs a pixel signal at a level (i.e., the potential of the floating diffusion FD) corresponding to the charge stored in the floating diffusion FD to the vertical signal line VSL via the selection transistor SEL. That is, with the configuration in which the floating diffusion FD is connected to the gate electrode of the amplification transistor AMP, the floating diffusion FD and the amplification transistor AMP function as conversion units that amplify the charge generated at the photodiode PD and converts the charge into a pixel signal at a level corresponding to the charge.

In the amplification transistor AMP, the source region and the well region are connected. Accordingly, the amplification transistor AMP is a source follower type, and the back-bias effect is reduced to zero (0) or a value close to zero. With this configuration, the amplification transistor AMP has a source follower (SF) gain of 1 or a value close to 1, and thus improvement of the conversion efficiency is achieved.

The selection transistor SEL is driven in accordance with a selection signal supplied from the drive circuit 36. When the selection transistor SEL is turned on, the pixel signal output from the amplification transistor AMP enters a state capable of being output to the vertical signal line VSL. The reset transistor RST is driven in accordance with a reset signal supplied from the drive circuit 36. When the reset transistor RST is turned on, the charge stored in the floating diffusion FD is discharged to the power supply line VDD, and the floating diffusion FD is reset.

The vertical signal line VSL is connected to a logic circuit 35 of the third substrate portion 30 via the wiring lines LA2 and LA3 provided in the pixel region RA and the electrode junction portion JA23 provided in the pixel region RA. The pixel signal output to the vertical signal line VSL is output to the logic circuit 35 via the wiring lines LA2 and LA3 and the electrode junction portion JA23.

The third substrate portion 30 includes the logic circuit 35 that processes a pixel signal. The logic circuit 35 includes, for example, the drive circuit 36, a comparator 37, and a control circuit 38. The drive circuit 36 selects the plurality of sensor pixels 12 in order on a row-by-row basis, for example. The comparator 37 performs, for example, correlated double sampling (CDS) processing on the pixel signal output from each sensor pixel 12 of the row selected by the drive circuit 36. The comparator 37 extracts a signal level of a pixel signal by performing CDS processing, holds pixel data corresponding to the amount of light received by each sensor pixel 12, and sequentially outputs the held pixel data to the outside, for example. The control circuit 38 controls driving of each block in the logic circuit 35 (for example, the drive circuit 36 and the comparator 37).

Figure 2:
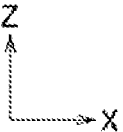
FIG. 2 is a cross-sectional view schematically illustrating the configuration example of the imaging device according to the first embodiment of the present disclosure.

FIG. 2 is a cross-sectional view schematically illustrating the configuration example of the imaging device 1 according to the first embodiment of the present disclosure. As illustrated in FIG. 2, in the imaging device 1, the second substrate portion 20 is stacked on the third substrate portion 30, and the first substrate portion 10 is stacked on the second substrate portion 20. Furthermore, a color filter CF and a microlens ML are arranged in this order on the first substrate portion 10 via a light-transmissive insulating film 102. The imaging device 1 is, for example, a back-illuminated CMOS image in which light is incident from the back surface side (in FIG. 1, upper side). The microlens ML and the color filter CF are arranged on the back surface side. Each of the microlens ML and the color filter CF are provided for each sensor pixel 12.

The first substrate portion 10 includes: the first semiconductor substrate 11 including, for example, a silicon substrate; an interlayer insulating film 101 (an example of a "first interlayer insulating film" of the present disclosure) provided on a front surface side (in FIG. 2, the lower surface side) of the first semiconductor substrate 11; the wiring lines LA1 and LB1 (see FIG. 1) embedded in the interlayer insulating film 101; and an electrode portion E11 (an example of a "first electrode portion" of the present disclosure) provided at the interlayer insulating film 101 on the opposite side of the surface facing the first semiconductor substrate 11.

The first semiconductor substrate 11 is provided with the photodiode PD, the transfer transistor TG, and the floating diffusion FD. The interlayer insulating film 101 includes, for example, one of a silicon oxide film ($SiO_2$ film), a silicon nitride film (SiN film), a silicon oxynitride film (SiON film), or a silicon carbonitride film (SiCN film), or two or more thereof. The interlayer insulating film 101 includes a laminated film obtained by laminating a plurality of films. The wiring lines LA1 and LB1 include a portion VL extending in the thickness direction of the substrate (for example, in the Z-axis direction) and a portion HL extending in the horizontal direction of the substrate (for example, in the X-axis direction and the Y-axis direction). In the wiring lines LA1 and LB1, the portion VL extending in the thickness direction includes, for example, tungsten (W), and the portion HL extending in the horizontal direction includes, for example, Cu or a Cu alloy. As an example, the portion HL of the wiring lines LA1 and LB1 extending in the horizontal direction includes two metal layers M11 and M12 in total. The electrode portion E11 includes, for example, Cu or a Cu alloy.

The second substrate portion 20 includes: the second semiconductor substrate 21 including, for example, a silicon substrate; an interlayer insulating film 201 (an example of a "third interlayer insulating film" of the present disclosure) provided on a front surface side (in FIG. 2, the lower surface side) of the second semiconductor substrate 21; an interlayer insulating film 203 (an example of a "second interlayer insulating film" of the present disclosure) provided on a back surface side (in FIG. 2, the upper surface side) of the second semiconductor substrate 21; an insulating isolation film 202 passing through between the front surface and the back surface of the second semiconductor substrate 21; the wiring lines LA2 and LB2 (see FIG. 1) embedded in at least one of the interlayer insulating film 201 or 203; an electrode portion E21 (an example of a "second electrode portion" of the present disclosure) provided at the interlayer insulating film 203 on the opposite side of the surface facing the second semiconductor substrate 21; and an electrode portion E22 (an example of a "third electrode portion" of the present disclosure) provided at the interlayer insulating film 201 on the opposite side of the surface facing the second semiconductor substrate 21.

The second semiconductor substrate 21 is provided with the amplification transistor AMP, the selection transistor SEL, and the reset transistor RST (see FIG. 1). As an example, one amplification transistor AMP, one selection transistor SEL, and one reset transistor RST are provided in one sensor pixel 12 (see FIG. 1).

For example, the interlayer insulating film 201 includes one of a $SiO_2$ film, a SiN film, a SiON film, and a SiCN film, or two or more thereof. The interlayer insulating film 201 includes a laminated film obtained by laminating a plurality of films. The interlayer insulating film 201 and the insulating isolation film 202 include, for example, a single-layer $SiO_2$ film, SiN film, SiON film, or SiCN film. Note that each of the interlayer insulating film 201 and the insulating isolation film 202 may include a laminated film obtained by laminating a plurality of films, similarly to the interlayer insulating film 201.

The wiring lines LA2 and LB2 include a portion VL extending in the thickness direction of the substrate (for example, in the Z-axis direction) and a portion HL extending in the horizontal direction of the substrate (for example, in the X-axis direction and the Y-axis direction). In the wiring lines LA2 and LB2, the portion VL extending in the thickness direction includes, for example, tungsten (W), and the portion HL extending in the horizontal direction includes, for example, Cu or a Cu alloy. Alternatively, in the wiring lines LA2 and LB2, the portion HL extending in the horizontal direction may include aluminum (Al) or an Al alloy containing Al as a main component. As an example, the portion HL of the wiring lines LA2 and LB2 extending in the horizontal direction includes five metal layers M21 to M25 in total. The metal layers M21 to M24 include Cu or a Cu alloy, and the metal layer M25 includes Al or an Al alloy. The electrode portions E21 and E22 include, for example, Cu or a Cu alloy.

The third substrate portion 30 includes: the third semiconductor substrate 31 including, for example, a silicon substrate; an interlayer insulating film 301 (an example of a "fourth interlayer insulating film" of the present disclosure) covering a side of the surface facing the second substrate portion 20 at the third semiconductor substrate 31; the wiring lines LA3 and LB3 (see FIG. 1) embedded in the interlayer insulating film 301; and an electrode portion E31 (an example of a "fourth electrode portion" of the present disclosure) provided at the interlayer insulating film 301 on the opposite side of the surface facing the third semiconductor substrate 31.

The third semiconductor substrate 31 is provided with a plurality of transistors constituting the logic circuit 35 (see FIG. 1) and impurity diffusion layers. The interlayer insulating film 301 covers a plurality of transistors constituting the logic circuit 35 and an impurity diffusion layer. For example, the interlayer insulating film 201 includes one of a SiO$_2$ film, a SiN film, a SiON film, and a SiCN film, or two or more thereof. The interlayer insulating film 301 includes a laminated film obtained by laminating a plurality of films.

The wiring lines LA3 and LB3 include a portion VL extending in the thickness direction of the substrate (for example, in the Z-axis direction) and a portion HL extending in the horizontal direction of the substrate (for example, in the X-axis direction and the Y-axis direction). In the wiring lines LA3 and LB3, the portion VL extending in the thickness direction includes, for example, tungsten (W), and the portion HL extending in the horizontal direction includes, for example, Cu or a Cu alloy. As an example, the portion HL of the wiring lines LA3 and LB3 extending in the horizontal direction includes three metal layers M31, M32 and M33 in total. The electrode portion E31 includes, for example, Cu or a Cu alloy.

Furthermore, the electrode portions E11, E21, E22 and E31 include, for example, Cu or a Cu alloy. The electrode portions E11 and E21 are directly joined in a state of facing each other, and are integrated by Cu—Cu joining, for example. With this configuration, the first substrate portion 10 and the second substrate portion 20 are electrically connected, and the strength of bonding between the first substrate portion 10 and the second substrate portion 20 is increased. Similarly, the electrode portions E22 and E31 are directly joined in a state of facing each other, and are integrated by Cu—Cu joining, for example. With this configuration, the second substrate portion 20 and the third substrate portion 30 are electrically connected, and the strength of bonding between the second substrate portion 20 and the third substrate portion 30 is increased.

Figure 3:
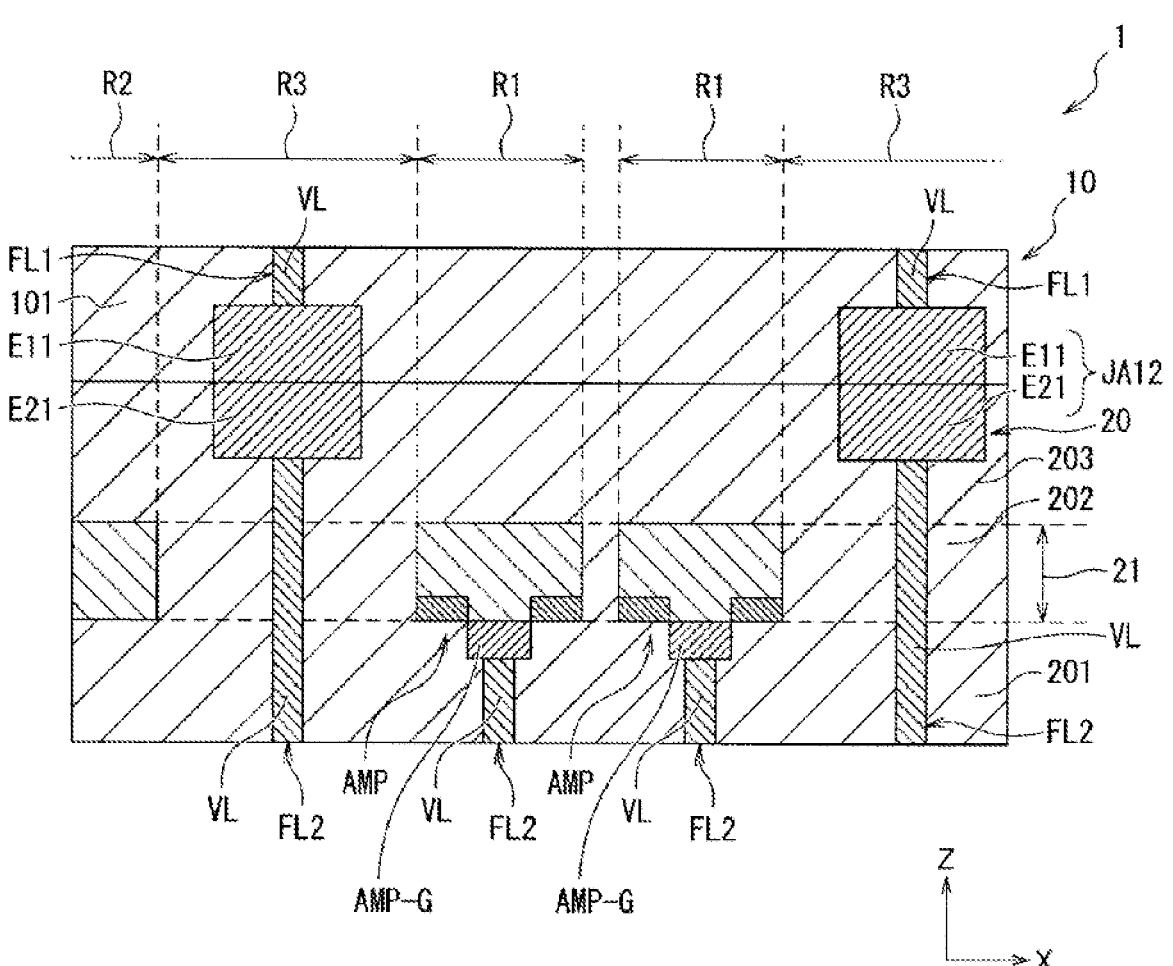
FIG. 3 is a cross-sectional view illustrating an amplification transistor and a peripheral portion thereof in the imaging device according to the first embodiment of the present disclosure in an enlarged manner.

FIG. 3 is a cross-sectional view illustrating the amplification transistor AMP and a peripheral portion thereof in the imaging device 1 according to the first embodiment of the present disclosure in an enlarged manner. As illustrated in FIG. 3, the second semiconductor substrate 21 includes: a first element region R1 in which the amplification transistor AMP is provided; a second element region R2 in which other elements than the amplification transistor AMP (for example, the reset transistor RST) are provided; and a through region R3 through which the second semiconductor substrate 21 passes in the thickness direction. The through region R3 is filled with the insulating isolation film 202. The insulating isolation film 202 buried in the through region R3 insulates and isolates two adjacent first element regions R1 from each other, and the adjacent first element region R1 and second element region R2 from each other.

The floating diffusion FD provided in the first substrate portion 10 is connected to the gate electrode of the amplification transistor AMP, via the wiring lines LA1 and LA2 and the electrode junction portion JA12, all of which are provided in the pixel region RA (see FIGS. 1 and 2). For example, the wiring line LA1 includes a first wiring line FL1 provided at the first substrate portion 10. The first wiring line FL1 is a wiring line connecting the floating diffusion FD and the electrode portion E11. Furthermore, the wiring line LA2 includes a second wiring line FL2 provided at the second substrate portion 20. The second wiring line FL2 is a wiring line connecting the electrode portion E21 and a gate electrode AMP-G of the amplification transistor AMP. The first wiring line FL1 and the second wiring line FL2 arranged in the pixel region are connected to each other via the electrode portion E11 and the electrode portion E21 which are Cu—Cu joined (the electrode junction portion JA12). Furthermore, the second wiring line FL2 runs through the through region R3 and is connected to the gate electrode AMP-G of the amplification transistor AMP.

Note that a portion of the second wiring line FL2 running through the through region R3 may be referred to as a through via. Furthermore, in a case where the second semiconductor substrate 21 includes silicon (Si), the through region R3 may be referred to as a through-Si region, and the through via described above may be referred to as a through-Si via (TSV) or a through-Si FD via.

(Manufacturing Method)

Next, a method of manufacturing the imaging device 1 will be described. Note that the imaging device 1 is manufactured using various apparatuses such as a film forming apparatus (including a chemical vapor deposition (CVD) apparatus and a sputtering apparatus), an ion implantation apparatus, a heat treatment apparatus, an etching apparatus, a chemical mechanical polishing (CMP) apparatus, and a substrate bonding apparatus. Hereinafter, these apparatuses are collectively referred to as a manufacturing apparatus.

Figure 4A:
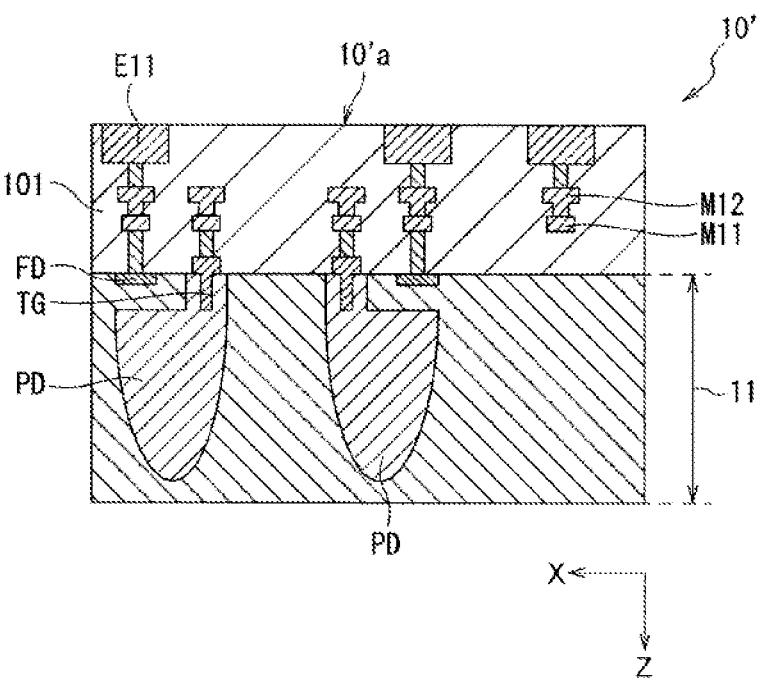
FIG. 4A is a cross-sectional view illustrating a method of manufacturing the imaging device according to the first embodiment of the present disclosure in order of processes.
Figure 4B:
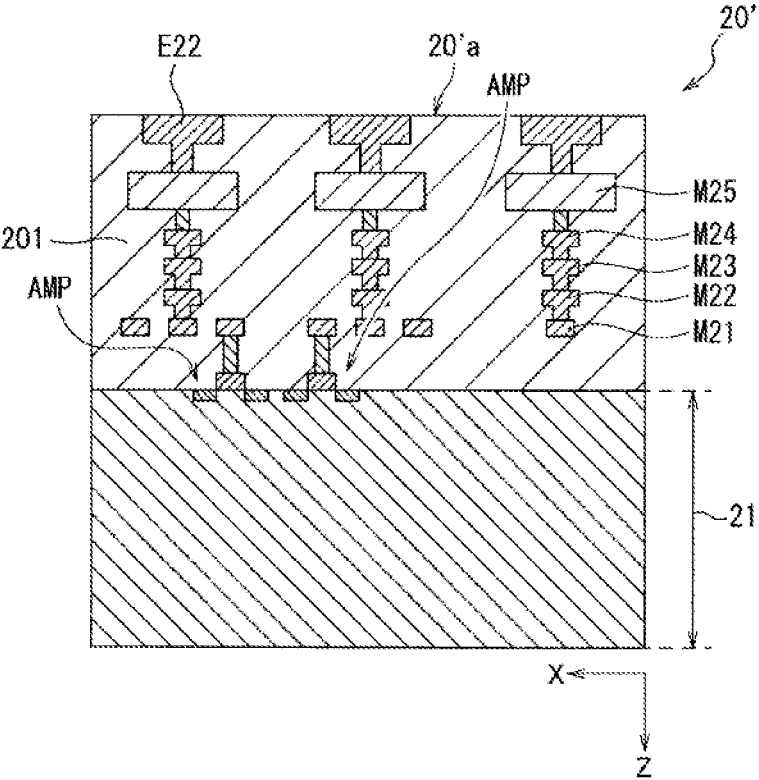
FIG. 4B is a cross-sectional view illustrating the method of manufacturing the imaging device according to the first embodiment of the present disclosure in order of processes.

FIGS. 4A to 4H are cross-sectional views illustrating the method of manufacturing the imaging device 1 according to the first embodiment of the present disclosure in order of processes. As illustrated in FIGS. 4A to 4B, the manufacturing apparatus separately manufactures a first substrate portion 10', a second substrate portion 20', and the third substrate portion 30 by using a CMOS process.

The difference of the first substrate portion 10' illustrated in FIG. 4A from the first substrate portion 10 illustrated in FIG. 2 is that the insulating film 102 is not formed. In this example, the insulating film 102 is formed after the first substrate portion 10' is bonded to the second substrate portion 20. An upper surface 10'$a$ of the first substrate portion 10' illustrated in FIG. 4A serves as a bonding surface to the second substrate portion 20. Furthermore, the difference of the second substrate portion 20' illustrated in FIG. 4B from the second substrate portion 20 illustrated in FIG. 2 is that the through region R3 and the like are not formed at the second semiconductor substrate 21, and that the insulating isolation film 202, the interlayer insulating film 203, and the like are not provided. In this example, the through region R3 and the like are formed after the second substrate portion 20' is bonded to the third substrate portion 30. An upper surface 20'$a$ of the second substrate portion 20' illustrated in FIG. 4B serves as a bonding surface to the third substrate portion 30.

Figure 4C:
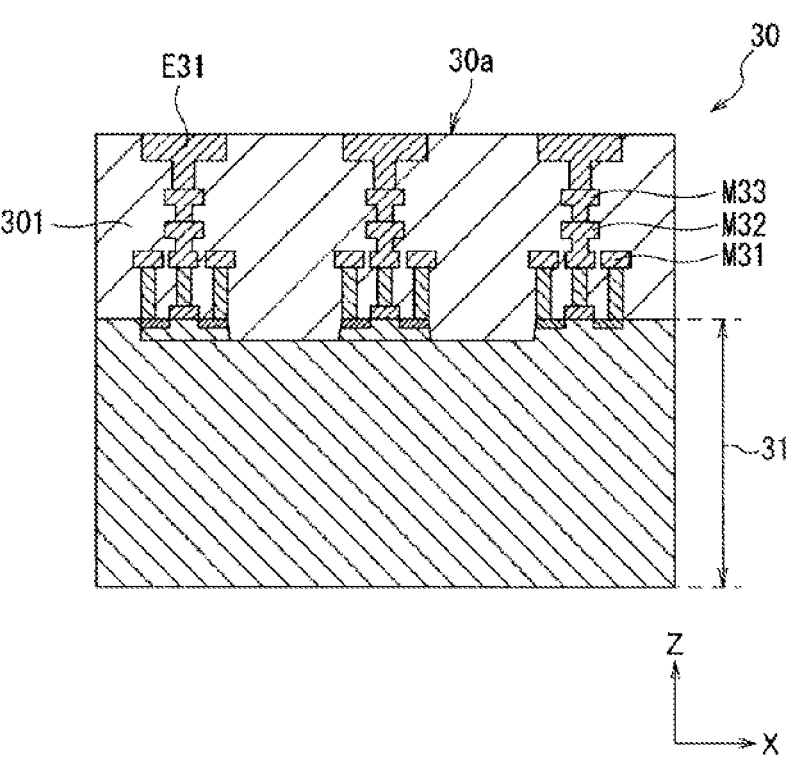
FIG. 4C is a cross-sectional view illustrating the method of manufacturing the imaging device according to the first embodiment of the present disclosure in order of processes.

Furthermore, an upper surface 30$a$ of the third substrate portion 30 illustrated in FIG. 4C serves as a bonding surface to the second substrate portion 20'.

Figure 4D:
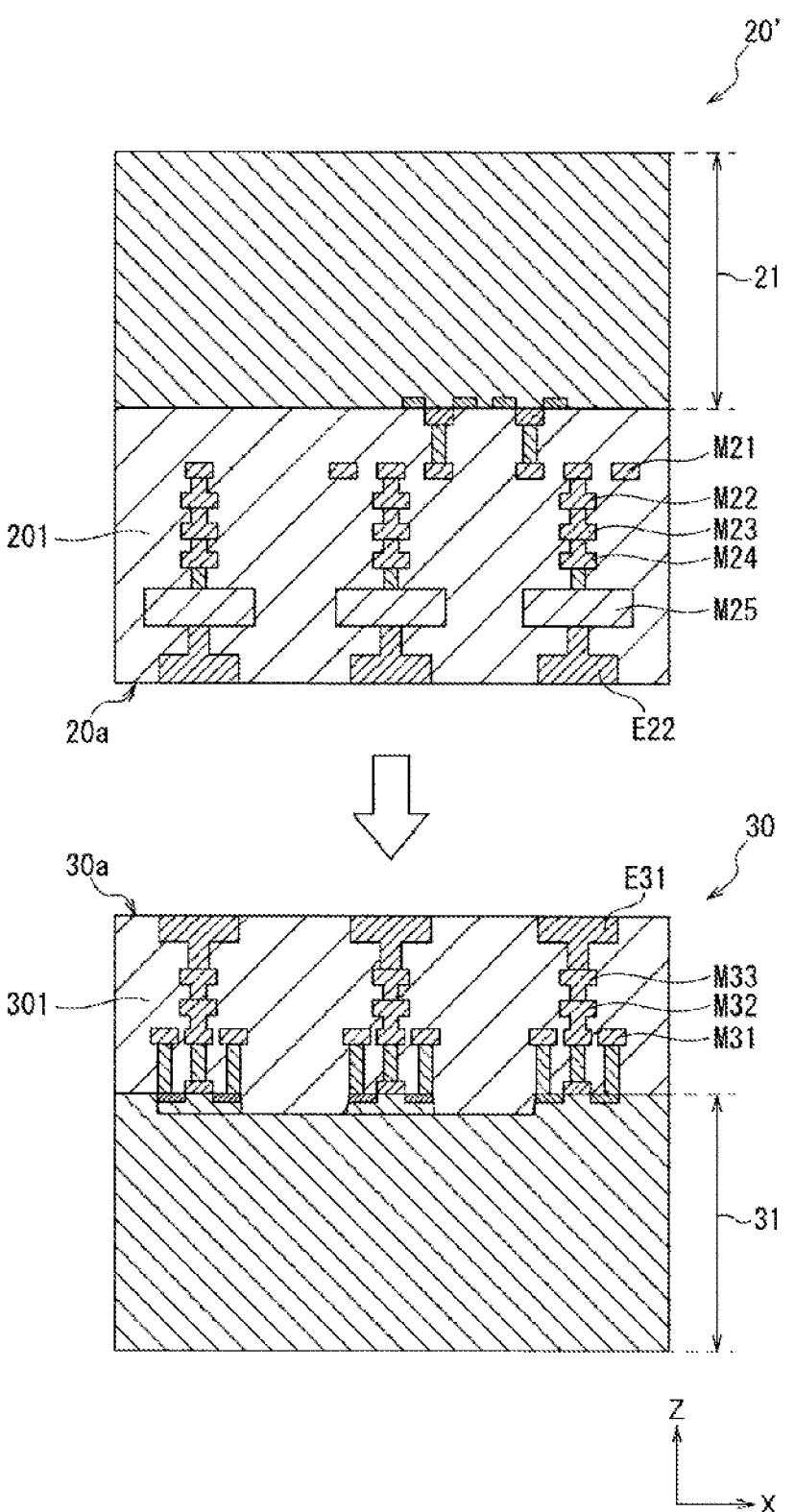
FIG. 4D is a cross-sectional view illustrating the method of manufacturing the imaging device according to the first embodiment of the present disclosure in order of processes.
Figure 4E:
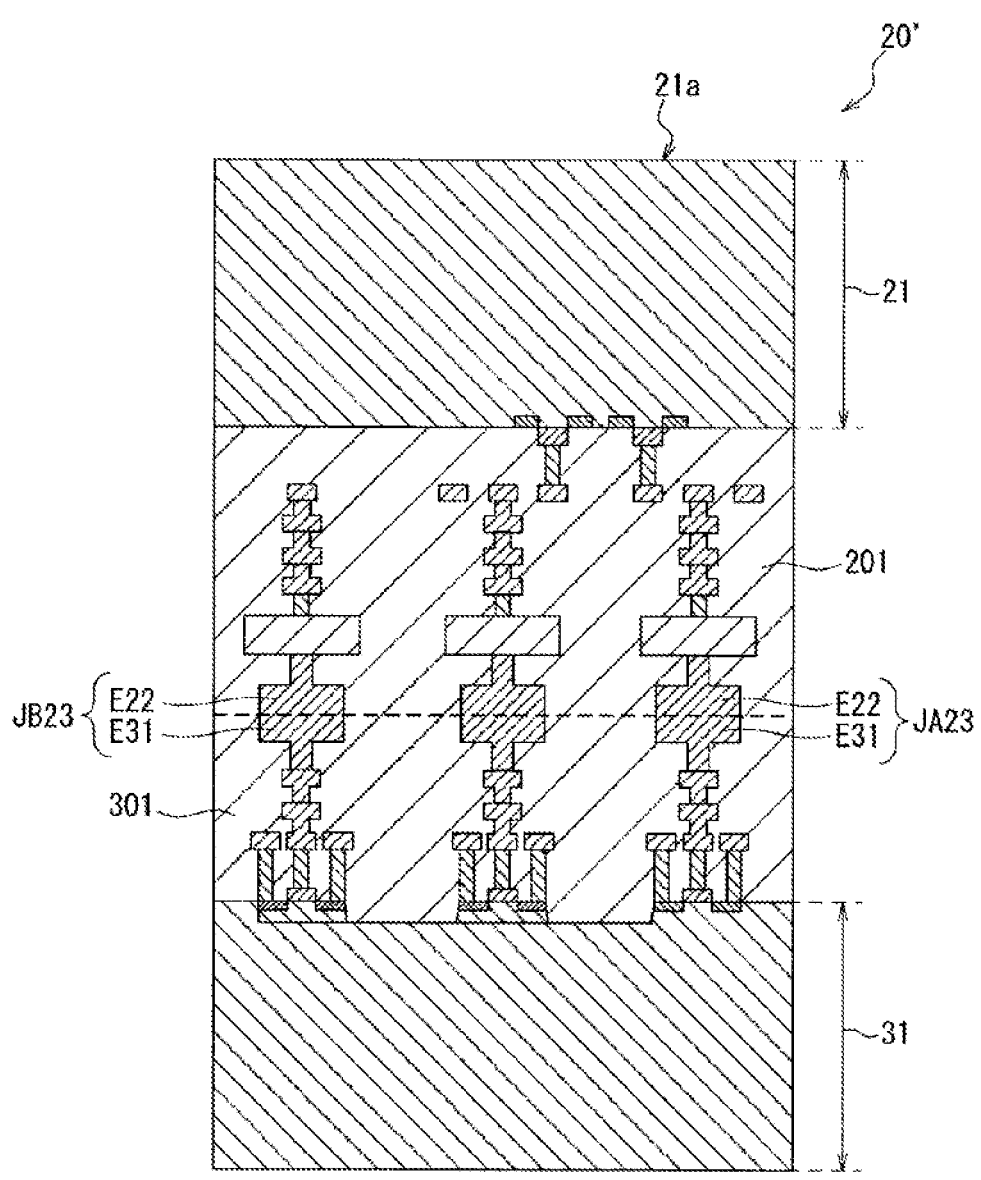
FIG. 4E is a cross-sectional view illustrating the method of manufacturing the imaging device according to the first embodiment of the present disclosure in order of processes.
Figure 4E:
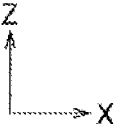

Next, as illustrated in FIG. 4D, the manufacturing apparatus bonds the second substrate portion 20' to the third substrate portion 30. By this bonding, the interlayer insulating film 201 and the interlayer insulating film 301 are joined as well as the electrode portion E22 and the electrode portion E31 are Cu—Cu joined, and thus as illustrated in FIG. 4E, the second substrate portion 20' and the third substrate portion 30 are integrated.

Figure 4F:
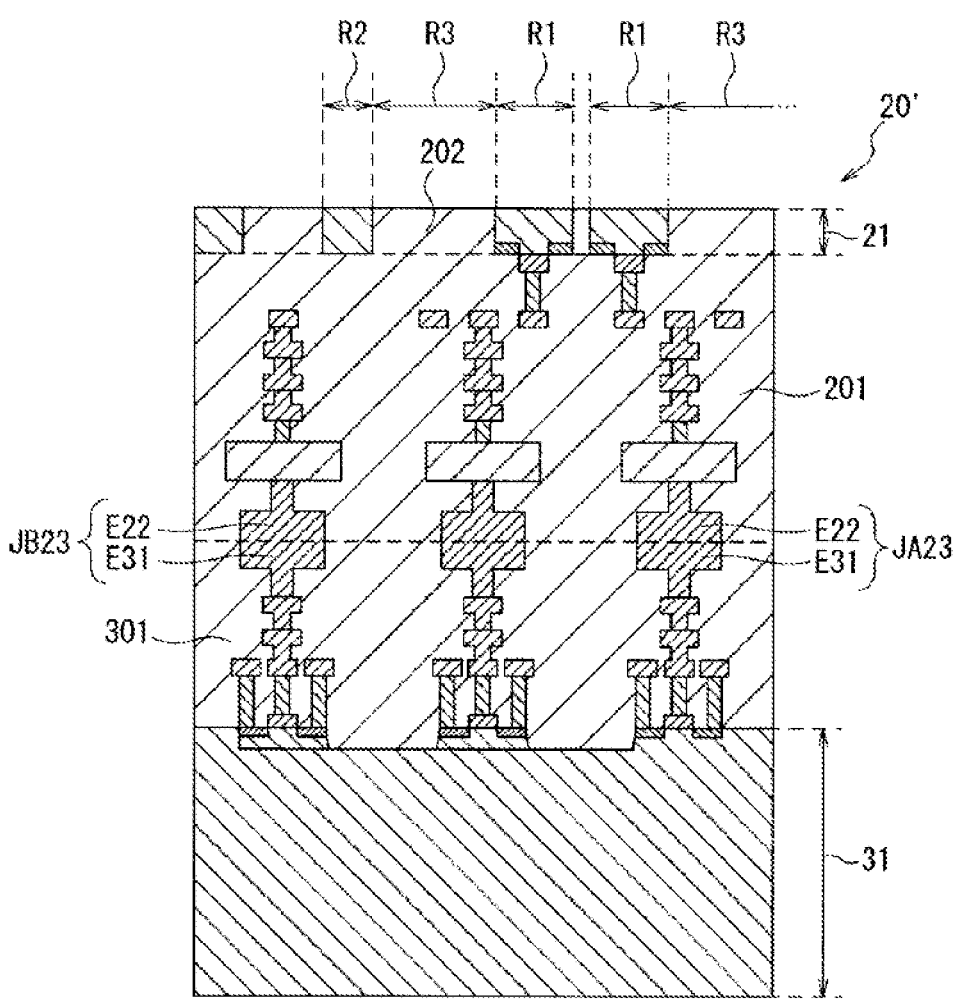
FIG. 4F is a cross-sectional view illustrating the method of manufacturing the imaging device according to the first embodiment of the present disclosure in order of processes.
Figure 4F:

Next, the manufacturing apparatus grinds a back surface 21$a$ (in FIG. 4E, the upper surface) side of the second semiconductor substrate 21 to reduce the film thickness of the second semiconductor substrate 21. Next, the manufacturing apparatus partially etches and removes the second semiconductor substrate 21 from the back surface 21$a$ side. With this process, as illustrated in FIG. 4F, the first element region R1, the second element region R2, and the through region R3 are formed in the second semiconductor substrate 21. In this example, the well isolation on the amplification transistor AMP and the through isolation on the second semiconductor substrate 21 are simultaneously performed in the same process. With this approach, the number of processes can be reduced as compared with the case where the well isolation and the through isolation are separately performed.

Next, the manufacturing apparatus forms an insulating film on the second semiconductor substrate 21, and performs CMP processing on the formed insulating film. With this process, the first element region R1 and the second element region R2 are exposed from under the insulating film, and the insulating isolation film 202 is formed in the through region R3.

Figure 4G:
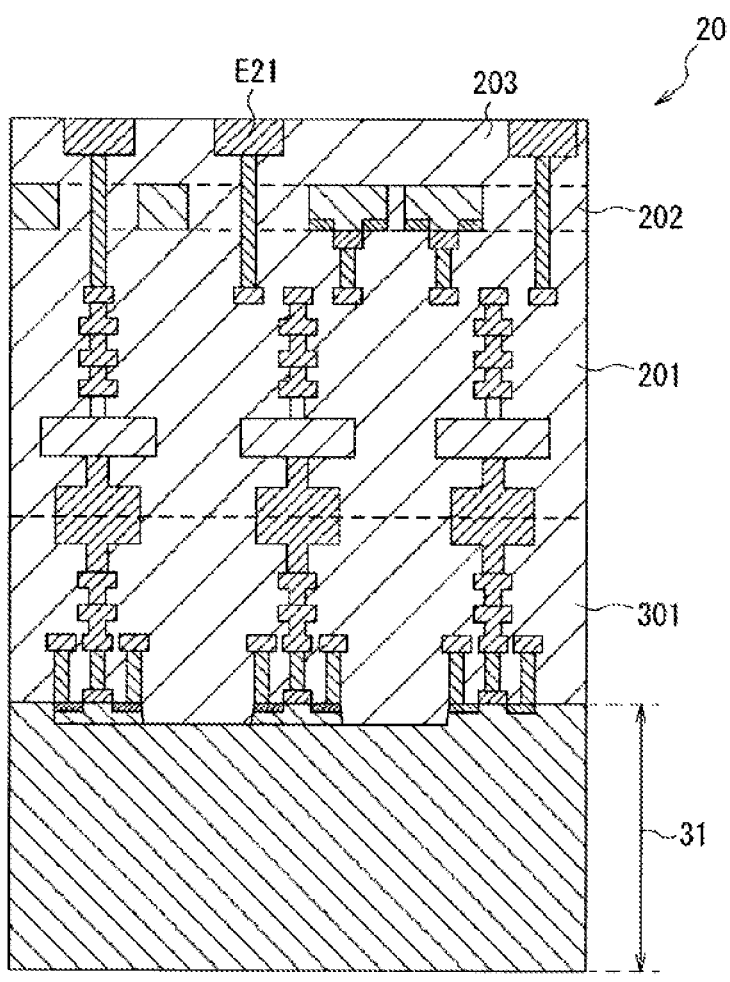
FIG. 4G is a cross-sectional view illustrating the method of manufacturing the imaging device according to the first embodiment of the present disclosure in order of processes.
Figure 4G:
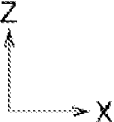
Figure 4H:
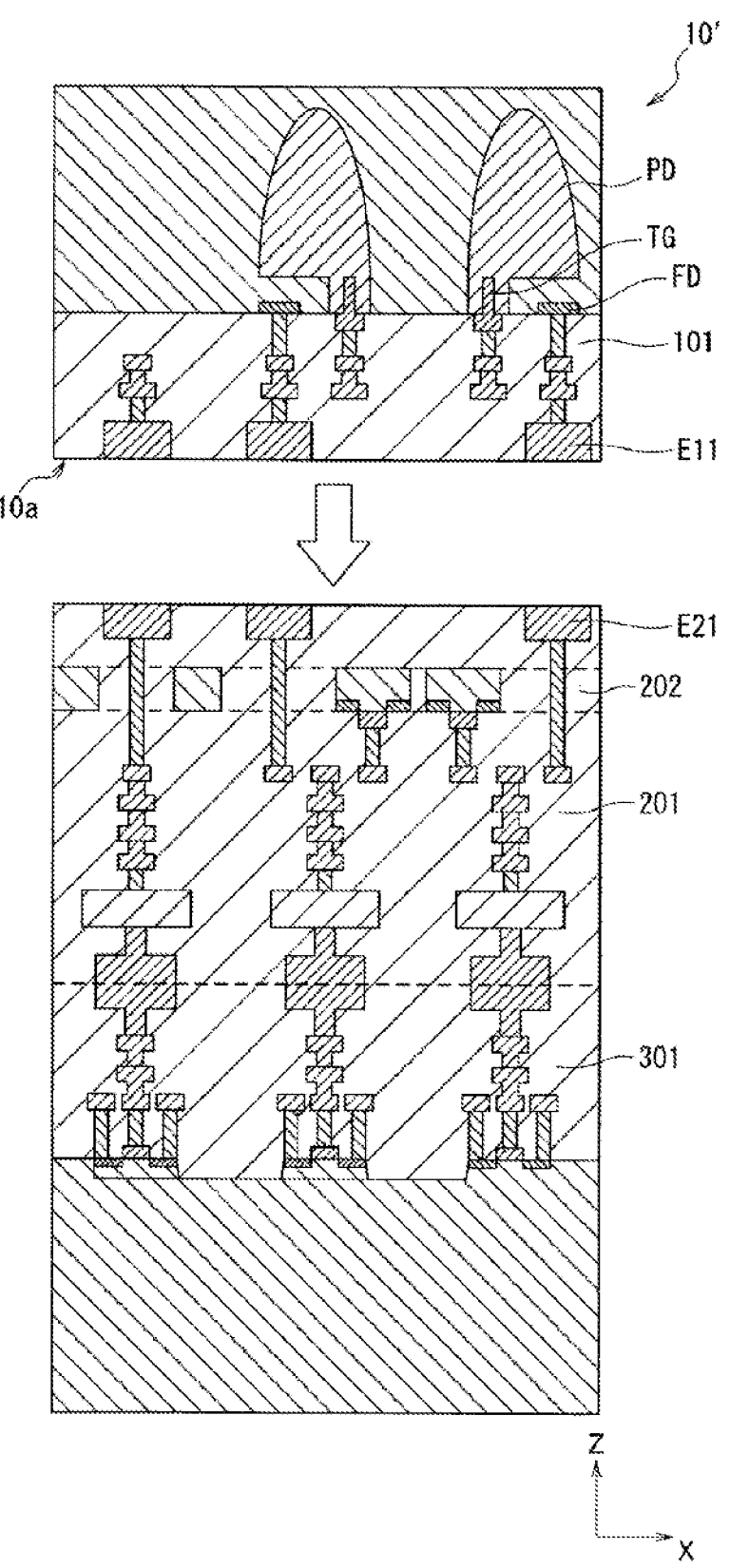
FIG. 4H is a cross-sectional view illustrating the method of manufacturing the imaging device according to the first embodiment of the present disclosure in order of processes.

Next, as illustrated in FIG. 4G, the manufacturing apparatus forms the interlayer insulating film 203, the wiring lines LA2 and LB2 (see FIG. 1), and the electrode portion E21. In this process, the second wiring line FL2, which is a part of the wiring line connecting the floating diffusion FD and the gate electrode AMP-G of the amplification transistor AMP, is formed. As a result, the second substrate portion 20 is completed. Next, as illustrated in FIG. 4H, the manufacturing apparatus bonds the third substrate portion 30 to the second substrate portion 20.

Thereafter, the manufacturing apparatus forms the insulating film 102 at the first substrate portion 10, forms the color filter CF on the insulating film 102, and attaches the microlens ML onto the color filter CF. Through the above processes, the imaging device 1 illustrated in FIGS. 1 to 3 is completed.

Effects of First Embodiment

As described above, the imaging device 1 according to the embodiment of the present disclosure includes the first substrate portion 10 and the second substrate portion 20 provided on one surface side of the first substrate portion 10. The first substrate portion 10 includes: the first semiconductor substrate 11; the sensor pixel 12 provided at the first semiconductor substrate 11 and performing photoelectric conversion; the interlayer insulating film 101 provided at the first semiconductor substrate 11 on the side of the surface facing the second substrate portion 20; and the electrode portion E11 provided at the interlayer insulating film 101 on the side of the surface facing the second substrate portion 20. The second substrate portion 20 includes: the second semiconductor substrate 21; the readout circuit 22 that is provided at the second semiconductor substrate 21 and outputs a pixel signal based on a charge output from the sensor pixel 12; the interlayer insulating film 203 provided at the second semiconductor substrate 21 on the side of the surface facing the first substrate portion 10; and the electrode portion E21 provided at the interlayer insulating film 203 on the side of the surface facing the first substrate portion 10. The electrode portion E11 and the electrode portion E21 are directly joined to each other. The readout circuit includes the amplification transistor AMP that amplifies a signal of a voltage corresponding to the level of a charge output from the sensor pixel 12. The second semiconductor substrate 21 includes: the first element region R1 in which the amplification transistor AMP is provided; the second element region R2 in which other elements than the amplification transistor AMP are provided; and the through region R3 through which the second semiconductor substrate 21 passes in the thickness direction. The first element region R1 and the second element region R2 are isolated by the through region R3.

With such a configuration, since the amplification transistor AMP is arranged in a stacked manner with respect to the sensor pixel 12, a wide area can easily be secured, and an increase in noise can be suppressed. Furthermore, since the amplification transistor AMP is insulated and isolated from other elements by the through region R3, the amplification transistor can be a source follower type in which the source region and the well region are connected. Therefore, the amplification transistor AMP can increase the SF gain, and can improve the conversion efficiency. As a result, the imaging device 1 can suppress deterioration in characteristics even while miniaturization and densification progress.

Furthermore, the second substrate portion 20 includes the insulating isolation film 202 provided in the through region R3 and a through wiring line passing through the insulating isolation film 202. For example, as the through wiring line, a part of the second wiring line FL2 connected to the gate electrode AMP-G of the amplification transistor AMP passes through the insulating isolation film 202. With such a configuration, the through region R3 is not only used as an isolation region for isolating the amplification transistor AMP from other elements, but also used as a wiring region for extending the second wiring line FL2 in the thickness direction of the second substrate portion 20 (Z-axis direction). As compared with a case where the isolation region and the wiring region are separately provided, the area of the pixel region can be reduced while the area of the amplification transistor is maintained.

Modification of First Embodiment

In the superordinate first embodiment, as illustrated in FIG. 2, the case where the gate electrode, the source region, and the drain region of the amplification transistor AMP are provided at the second semiconductor substrate 21 on the side of the surface facing the third substrate portion 30 has been described. However, the present disclosure is not limited thereto. The gate electrode, the source region, and the drain region of the amplification transistor AMP may be provided on the side of the first substrate portion 10.

Figure 5:
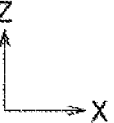
FIG. 5 is a cross-sectional view schematically illustrating a configuration of an imaging device according to a modification of the first embodiment of the present disclosure.
Figure 6:
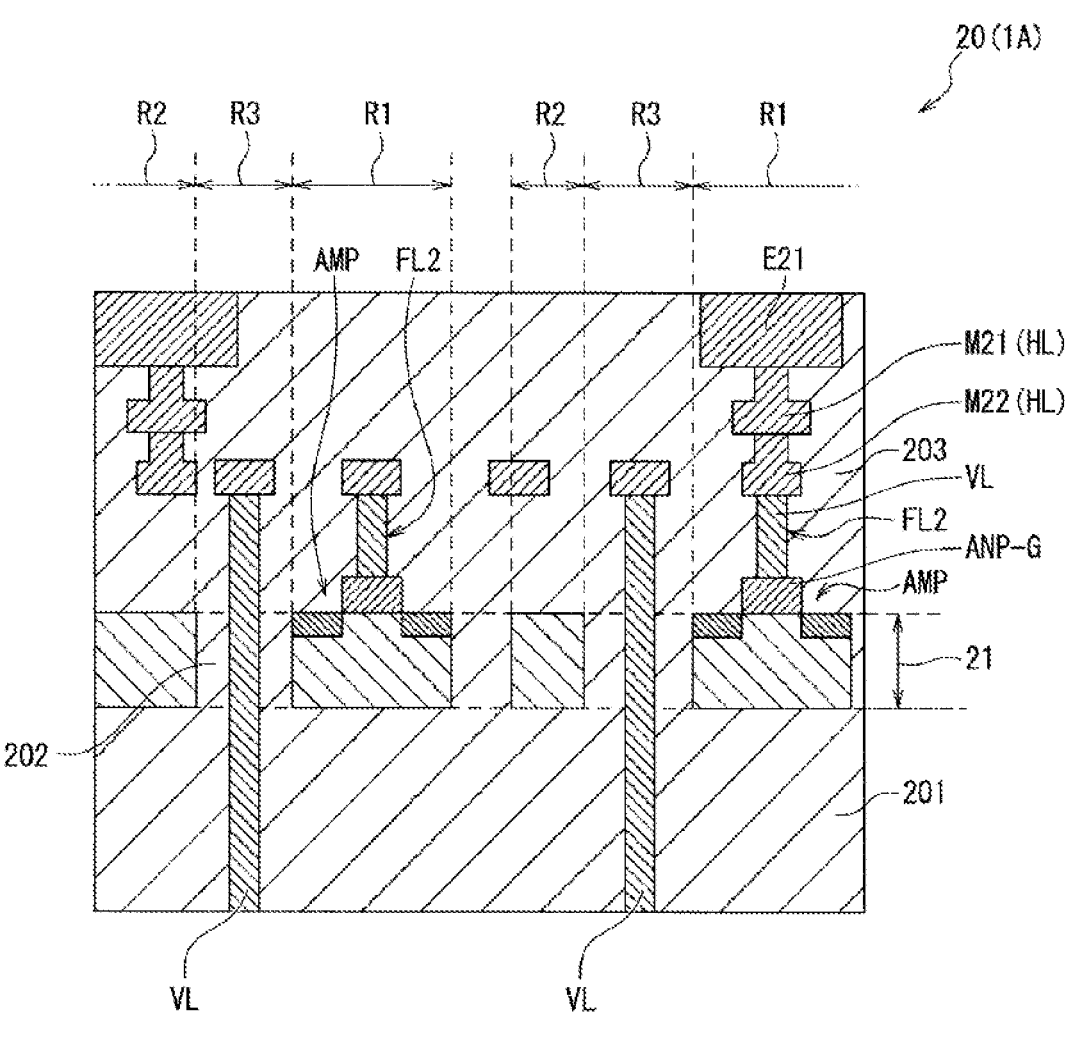
FIG. 6 is a cross-sectional view illustrating an amplification transistor and a peripheral portion thereof in the imaging device according to the modification of the first embodiment of the present disclosure in an enlarged manner.

FIG. 5 is a cross-sectional view schematically illustrating a configuration of an imaging device 1A according to a modification of the first embodiment of the present disclosure. FIG. 6 is a cross-sectional view illustrating the amplification transistor AMP and a peripheral portion thereof in the imaging device 1A according to the modification of the first embodiment of the present disclosure in an enlarged manner. As illustrated in FIGS. 5 and 6, in the imaging device 1A, the gate electrode AMP-G, the source region, and the drain region of the amplification transistor AMP are provided on the side of the first substrate portion 10.

Even with such a configuration, since the amplification transistor AMP is arranged in a stacked manner with respect to the sensor pixel 12, a wide area can easily be secured, and an increase in noise can be suppressed. Furthermore, since the amplification transistor AMP is insulated and isolated from other elements by the through region R3, the amplification transistor can be a source follower type. Therefore, the amplification transistor AMP can increase the SF gain, and can improve the conversion efficiency. As a result, the imaging device 1A can suppress deterioration in characteristics resulting from miniaturization and densification.

Second Embodiment

Configuration Example

Figure 7:
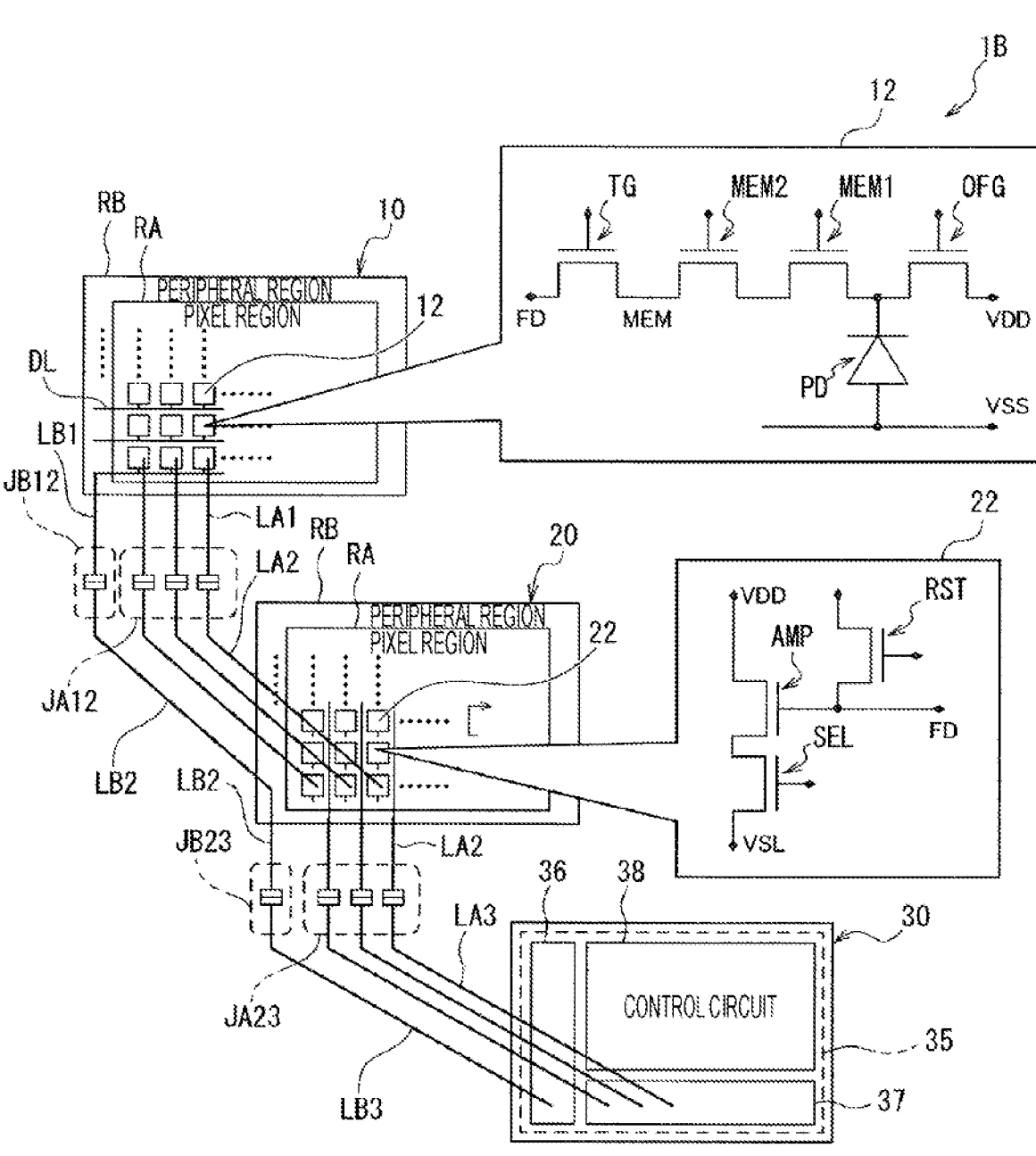
FIG. 7 is a schematic diagram illustrating a configuration example of an imaging device according to a second embodiment of the present disclosure.

The imaging device according to the embodiments of the present disclosure may be, for example, a memory-holding global shutter. FIG. 7 is a schematic diagram illustrating a configuration example of an imaging device 1B according to a second embodiment of the present disclosure. As illustrated in FIG. 7, in the imaging device 1A, the sensor pixel 12 of the first substrate portion 10 includes the photodiode PD, the transfer transistor TG, the floating diffusion FD, the overflow transistor OFG, a first memory transistor MEM1, and a second memory transistor MEM2.

The transfer transistor TG, the second memory transistor MEM2, and the first memory transistor MEM1 are connected in series in this order. A connection region (source region or drain region) between the transfer transistor TG and the second memory transistor MEM2 is a MEM unit (storage unit).

One of the first memory transistor MEM1 and the second memory transistor MEM2 is used to hold a noise charge caused by stray light in a state of holding the signal charge converted at the photodiode PD. Furthermore, the other of the first memory transistor MEM1 and the second memory transistor MEM2 is used to hold a noise charge caused by stray light in a state of not holding the signal charge converted at the photodiode PD.

For the first memory transistor MEM1 and the second memory transistor MEM2, a buried-channel charge coupled device (CCD) may be used, for example. By using CCDs for the first memory transistor MEM1 and the second memory transistor MEM2, the charges stored in the first memory transistor MEM1 and the second memory transistor MEM2 can be completely transferred to the respective subsequent stages.

Figure 8:
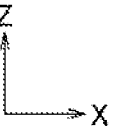
FIG. 8 is a cross-sectional view schematically illustrating the configuration example of the imaging device according to the second embodiment of the present disclosure.
Figure 9:
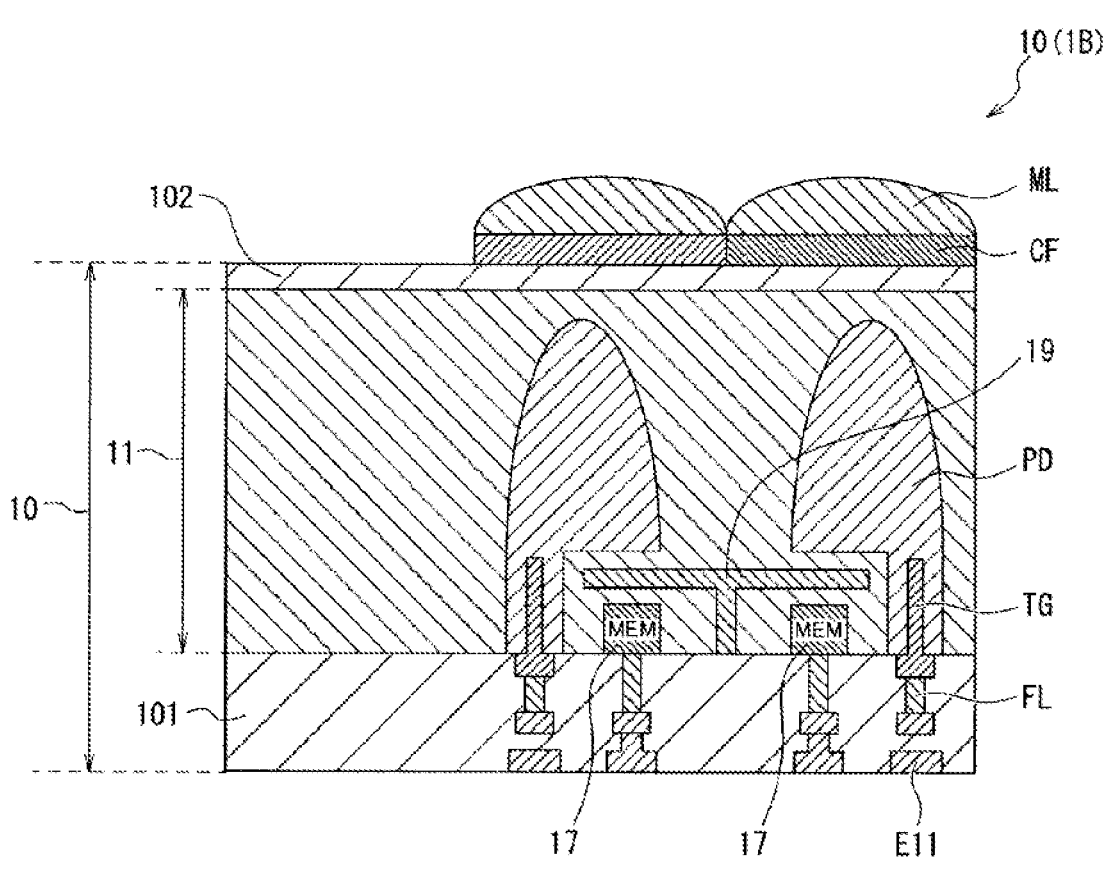
FIG. 9 is a cross-sectional view illustrating a photodiode provided at a first semiconductor substrate and a peripheral portion of the photodiode in the imaging device according to the second embodiment of the present disclosure in an enlarged manner.

FIG. 8 is a cross-sectional view schematically illustrating the configuration example of the imaging device 1B according to the second embodiment of the present disclosure. FIG. 9 is a cross-sectional view illustrating the photodiode PD provided at the first semiconductor substrate 11 and a peripheral portion of the photodiode PD in the imaging device 1B according to the second embodiment of the present disclosure in an enlarged manner. As illustrated in FIGS. 8 and 9, the first semiconductor substrate 11 of the imaging device 1B is provided with a MEM unit 17 including an impure diffusion layer having the same conductivity type as the floating diffusion, and a light-shielding portion 19 covering the MEM unit 17. The light-shielding portion 19 prevents light from being incident on the MEM unit 17 from the microlens ML side. Furthermore, the light-shielding portion 19 is also arranged between the adjacent MEM units 17. The light-shielding portion 19 includes, for example, a material having a light-shielding property, such as aluminum (Al) or tungsten (W).

Effects of Second Embodiment

Since the imaging device 1B according to the second embodiment has the configuration similar to that of the imaging device 1 according to the first embodiment, the imaging device 1B has the effect similar to that of the imaging device 1. Furthermore, since the sensor pixel 12 of the imaging device 1B includes the MEM unit 17, noise caused by stray light can be reduced.

Third Embodiment

Configuration Example

In the imaging device according to the embodiments of the present disclosure, a plurality of sensor pixels may share one floating diffusion. Furthermore, in the insulating isolation film 202 filling the through region R3, an air gap portion may be provided between a wiring line and the side surface of the second semiconductor substrate 21.

Figure 10:
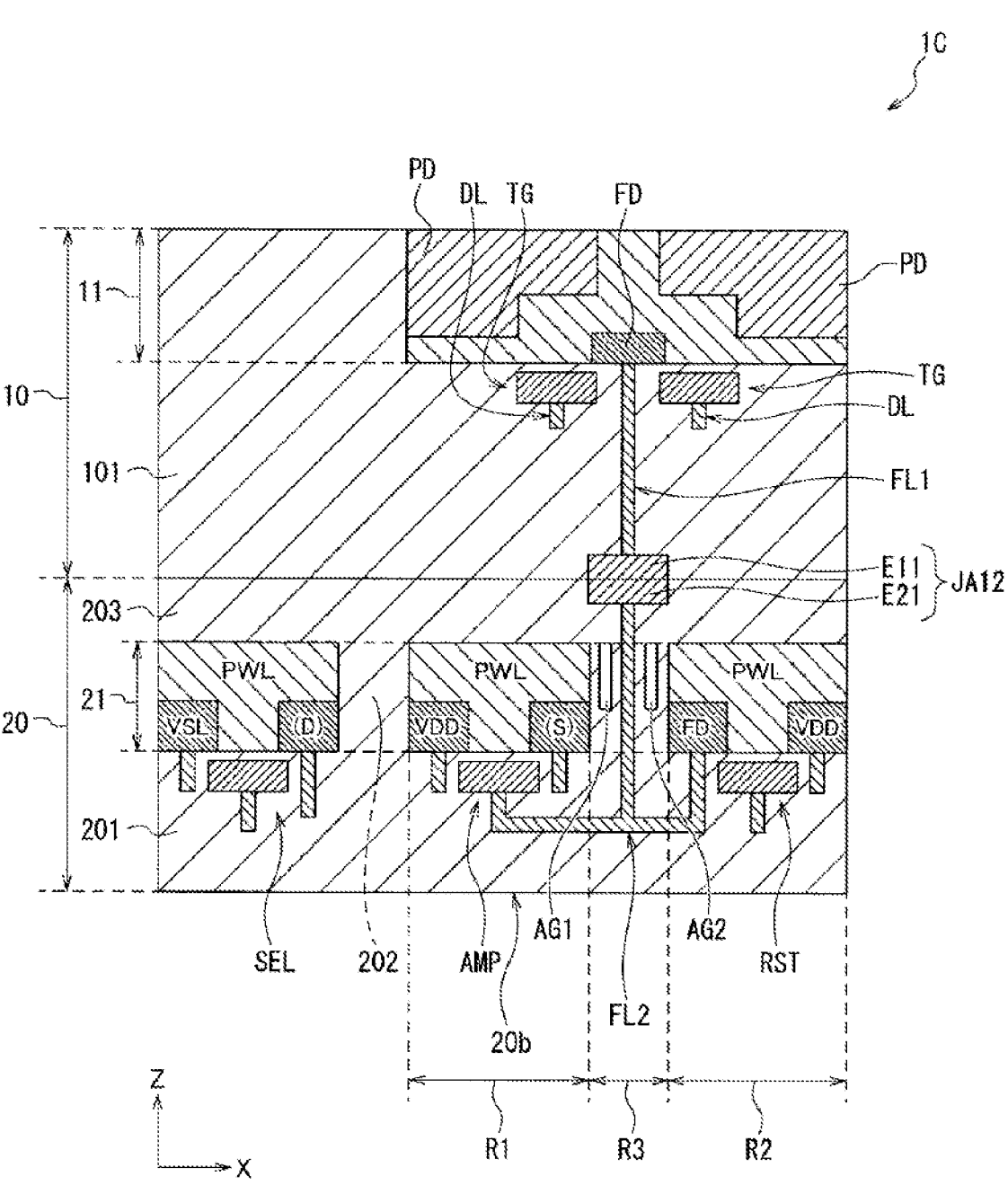
FIG. 10 is a cross-sectional view schematically illustrating a configuration example of an imaging device according to a third embodiment of the present disclosure.
Figure 11:
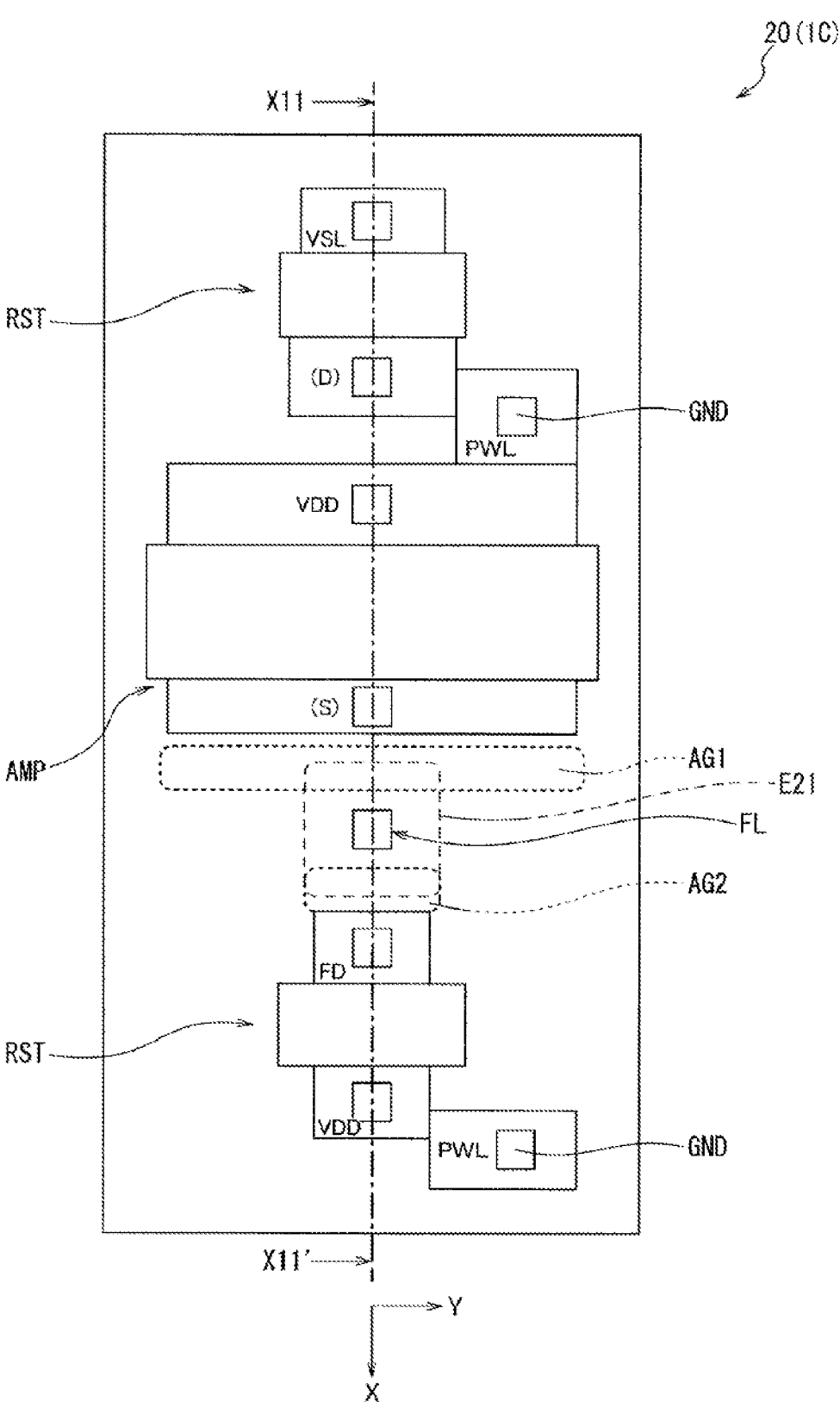
FIG. 11 is a plan view schematically illustrating a configuration example of a second substrate portion in the imaging device according to the third embodiment of the present disclosure.
Figure 12:
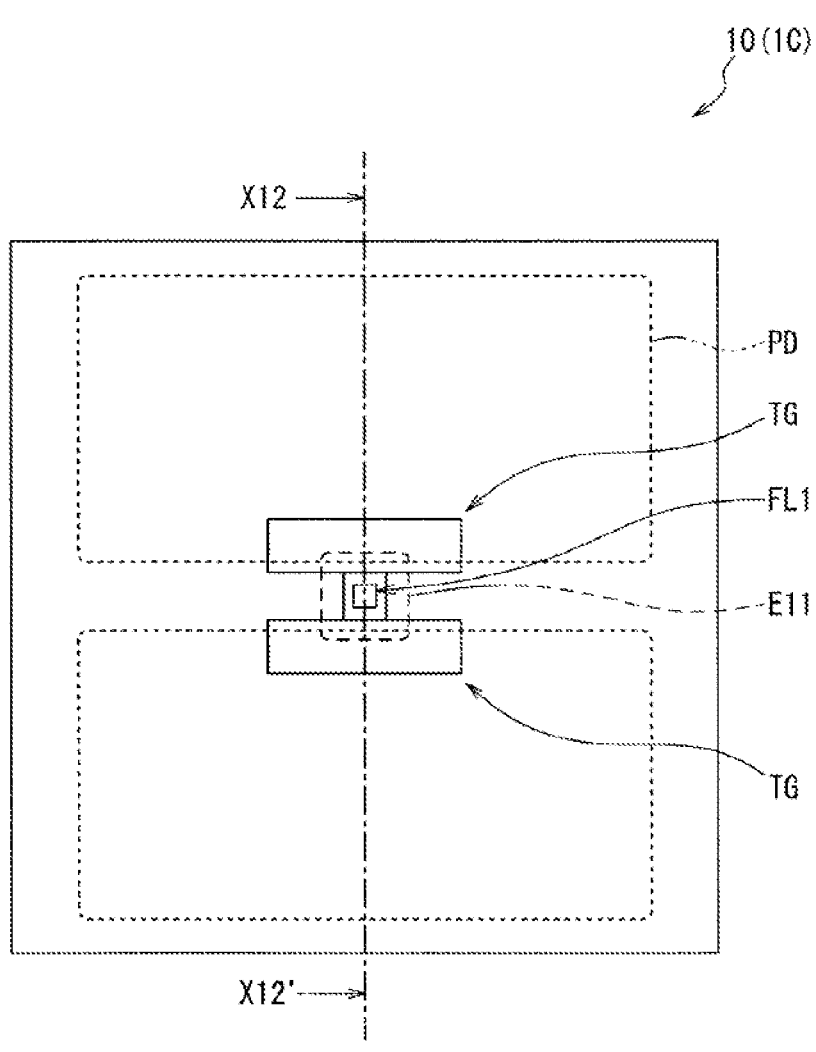
FIG. 12 is a plan view schematically illustrating a configuration example of a first substrate portion in the imaging device according to the third embodiment of the present disclosure.

FIG. 10 is a cross-sectional view schematically illustrating a configuration example of an imaging device 1C according to a third embodiment of the present disclosure. FIG. 11 is a plan view schematically illustrating a configuration example of the second substrate portion 20 in the imaging device 1C according to the third embodiment of the present disclosure. FIG. 12 is a plan view schematically illustrating a configuration example of the first substrate portion 10 in the imaging device 1C according to the third embodiment of the present disclosure. A cross section of the plan view of FIG. 11 taken along line X11-X11' corresponds to the cross section of the second substrate portion 20 illustrated in FIG. 10. A cross section of the plan view of FIG. 12 taken along line X12-X12' corresponds to the cross section of the first substrate portion 10 illustrated in FIG. 10. Note that, in FIGS. 10 and 11, in order to indicate the potential (connection destination) of the source region or the drain region of the transistor, a part of the source region or the drain region is denoted by signs "FD" or "VDD". Furthermore, "NWL" added to the second semiconductor substrate 21 means an N-type well region.

As illustrated in FIGS. 10 and 12, in the imaging device 1C, two sensor pixels share one floating diffusion FD. Furthermore, as illustrated in FIG. 10, in the imaging device 1C, the amplification transistor AMP in the first element region R1 of the second semiconductor substrate 21 and the reset transistor RST provided in the second element region R2 of the second semiconductor substrate 21 are adjacent to each other with the through region R3 interposed therebetween.

In the amplification transistor AMP, a source region (S) and a P-type well region PWL are connected. Accordingly, the amplification transistor AMP is a source follower type. Furthermore, the source region (S) of the amplification transistor AMP is connected to a drain region (D) of the selection transistor SEL via a wiring line.

Furthermore, the second wiring line FL2 connected to the floating diffusion runs through the insulating isolation film 202 buried in the through region R3 between the amplification transistor AMP and the reset transistor RST. A first air gap portion AG1 is provided between the amplification transistor AMP and the second wiring line FL2. A second air gap portion AG2 is provided between the reset transistor and the second wiring line FL2.

The potential of the second wiring line FL2 is the same as or substantially the same as that of the floating diffusion, and is different from the potential of the P-type well region PWL of the amplification transistor AMP. Therefore, a capacitance is generated between the second wiring line FL2 and the well region PWL of the amplification transistor AMP. Similarly, since the potential of the second wiring line FL2 is different from the potential of the well region PWL of the reset transistor RST, a capacitance is also generated between the second wiring line FL2 and the well region PWL of the amplification transistor AMP. Due to these capacitances, there is a possibility that the conversion efficiency of the amplification transistor AMP decreases.

However, in the imaging device 1C, the first air gap portion AG1 is provided between the second wiring line FL2 and the well region PWL of the amplification transistor AMP. Furthermore, the second air gap portion AG2 is provided between the second wiring line FL2 and the well region PWL of the reset transistor RST. The air constituting the air gap portion has a dielectric constant higher than that of a silicon oxide film (SiO$_2$ film) as an example of the interlayer insulating film 201. Therefore, the capacitance between the second wiring line FL2 and the well region PWL of the amplification transistor AMP is reduced by the first air gap portion AG1, and the capacitance between the second wiring line FL2 and the well region PWL of the reset transistor RST is reduced by the second air gap portion AG2. As a result, the imaging device 1C can suppress a decrease in the conversion efficiency of the amplification transistor AMP.

As illustrated in FIG. 10, the first air gap portion AG1 is preferably formed deep in the thickness direction of the second semiconductor substrate 21 (for example, in the Z-axis direction) to such an extent that the first air gap portion AG1 can face the whole portion exposed on the side surface of the second semiconductor substrate 21, of the well region PWL of the amplification transistor AMP. Furthermore, as illustrated in FIG. 11, the first air gap portion AG1 is preferably formed to be long to the same extent as the well region under the drain region (D) of the amplification transistor AMP also in the gate width direction of the amplification transistor AMP (Y-axis direction). With this configuration, since the first air gap portion AG1 can be widely interposed between the well region PWL of the amplification transistor AMP and the second wiring line FL2, the capacitance of the second wiring line FL2 can be effectively reduced.

Similarly, the second air gap portion AG2 is preferably formed deep in the thickness direction of the second semiconductor substrate 21 (for example, in the Z-axis direction) to such an extent that the second air gap portion AG2 can face the whole portion exposed on the side surface of the second semiconductor substrate 21, of the well region PWL of the reset transistor RST. Furthermore, as illustrated in FIG. 11, the second air gap portion AG2 is preferably formed to be long to the same extent as the well region under the drain region of the reset transistor RST also in the gate width direction of the reset transistor RST (Y-axis direction). With this configuration, since the second air gap portion AG2 can be widely interposed between the well region PWL of the reset transistor RST and the second wiring line FL2, the capacitance of the second wiring line FL2 can be effectively reduced.

(Manufacturing Method)

Figure 13A:
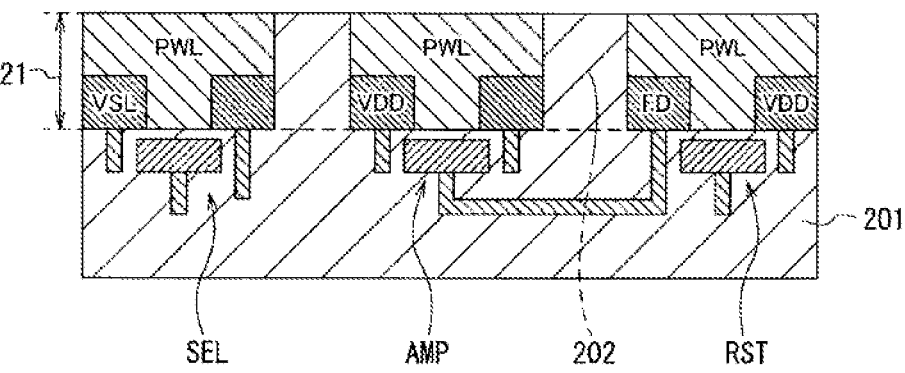
FIG. 13A is a cross-sectional view illustrating a method of manufacturing the imaging device according to the third embodiment of the present disclosure in order of processes.
Figure 13B:
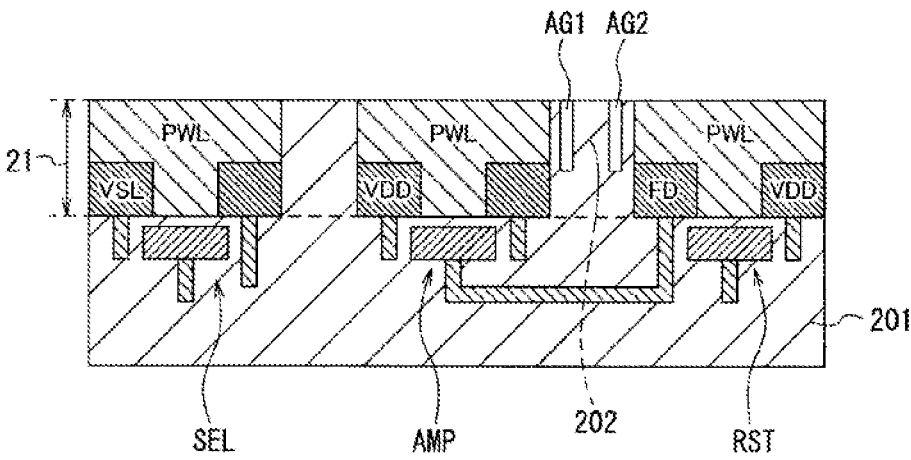
FIG. 13B is a cross-sectional view illustrating the method of manufacturing the imaging device according to the third embodiment of the present disclosure in order of processes.

Next, a method of manufacturing the imaging device 1C will be described. FIGS. 13A to 13E are cross-sectional views illustrating the method of manufacturing the imaging device 1C according to the third embodiment of the present disclosure in order of processes. In FIG. 13A, the process from grinding the back surface of the second semiconductor substrate 21, etching the second semiconductor substrate 21 to form the first element region R1, the second element region R2, and the through region R3, to forming the insulating isolation film 202 in the through region R3 is similar to, for example, that in the first embodiment (see FIGS. 4A to 4F). After the formation of the insulating isolation film 202, as illustrated in FIG. 13B, the manufacturing apparatus partially etches the insulating isolation film 202 in the through region R3 to form the first air gap portion AG1 and the second air gap portion AG2.

Figure 13C:
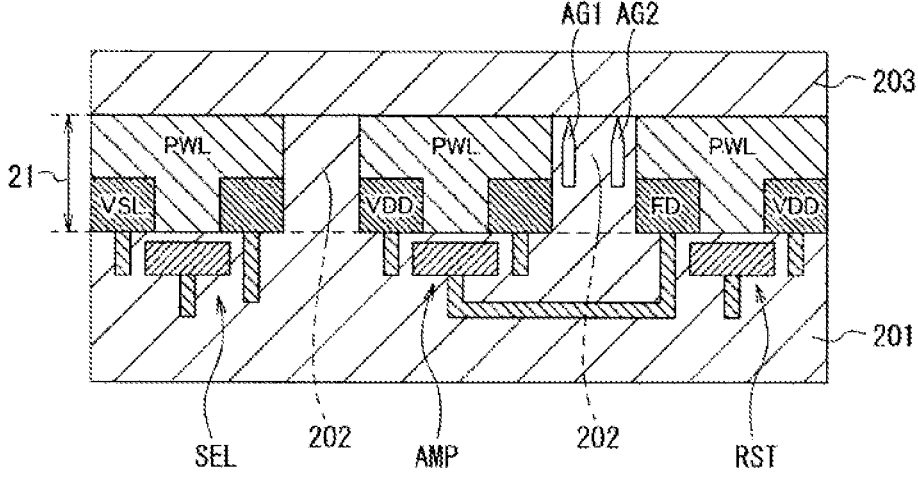
FIG. 13C is a cross-sectional view illustrating the method of manufacturing the imaging device according to the third embodiment of the present disclosure in order of processes.
Figure 13D:
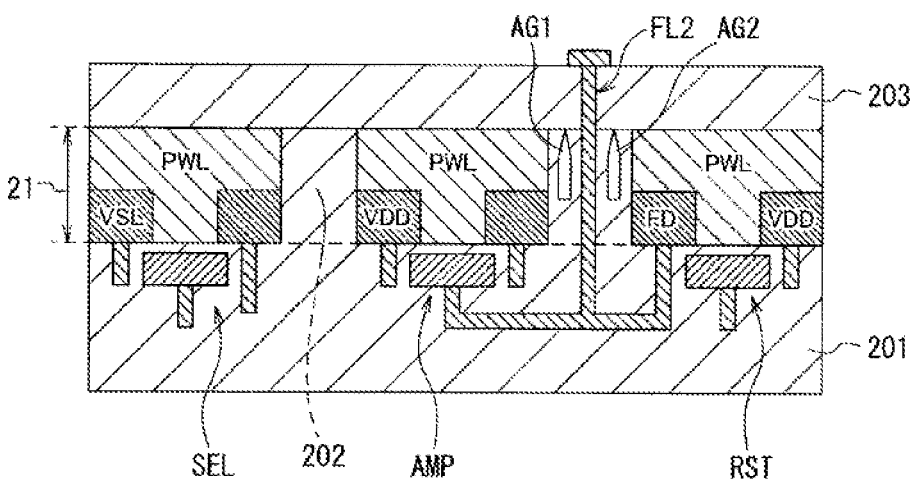
FIG. 13D is a cross-sectional view illustrating the method of manufacturing the imaging device according to the third embodiment of the present disclosure in order of processes.
Figure 13E:
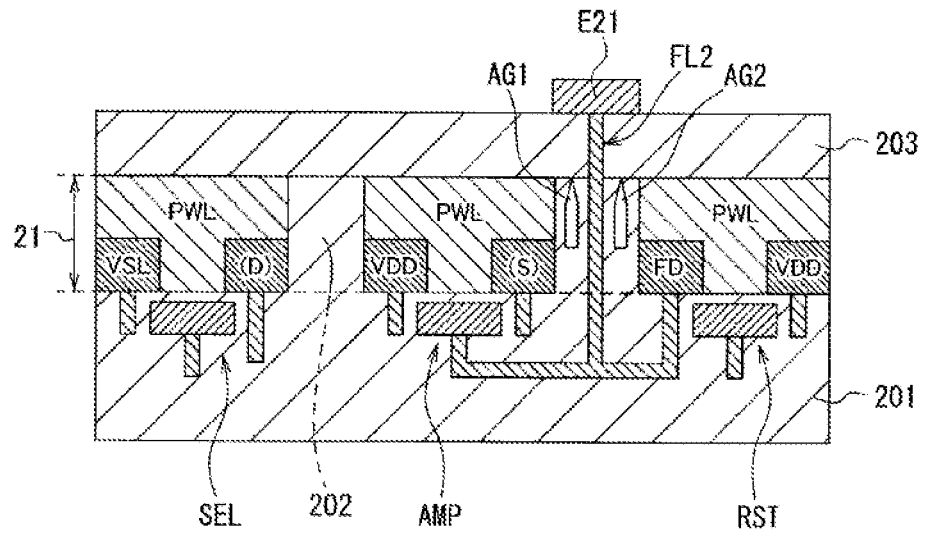
FIG. 13E is a cross-sectional view illustrating the method of manufacturing the imaging device according to the third embodiment of the present disclosure in order of processes.

Next, as illustrated in FIG. 13C, the manufacturing apparatus forms the interlayer insulating film 203 on the back surface side of the second semiconductor substrate 21. Each opening end of the first air gap portion AG1 and the second air gap portion AG2 are closed (pinched off) by the interlayer insulating film 203. Next, as illustrated in FIG. 13D, the manufacturing apparatus forms a through via to be a part of the second wiring line FL2 between the first air gap portion AG1 and the second air gap portion AG2. Next, as illustrated in FIG. 13E, the manufacturing apparatus forms the electrode portion E21. The subsequent processes are similar to those in the first embodiment (see FIG. 4H). Through the above processes, the imaging device 1C is completed.

Effects of Third Embodiment

Since the imaging device 1C according to the third embodiment has the configuration similar to that of the imaging device 1 according to the first embodiment, the imaging device 1C has the effect similar to that of the imaging device 1. Furthermore, the second substrate portion 20 of the imaging device 1C includes a first air gap portion AG1 and a second air gap portion AG2 provided at the insulating isolation film 202. The first air gap portion AG1 is positioned between the second wiring line FL2 and the side surface of the first element region R1. The second air gap portion AG2 is positioned between the second wiring line FL2 and the side surface of the second element region R2. With this configuration, since the imaging device 1C can reduce the capacitance of the second wiring line FL2, a decrease in the conversion efficiency of the amplification transistor AMP arising from the wiring capacitance can be reduced.

First Modification of Third Embodiment

In the embodiments of the present disclosure, the first air gap portion AG1 and the second air gap portion AG2 may be formed long so as to cover not only the side surface of the well region PWL but also the side surface of the source region or the side surface of the drain region of the transistor. That is, the first air gap portion AG1 and the second air gap portion AG2 may be formed to have the same thickness as the second semiconductor substrate 21.

Figure 14:
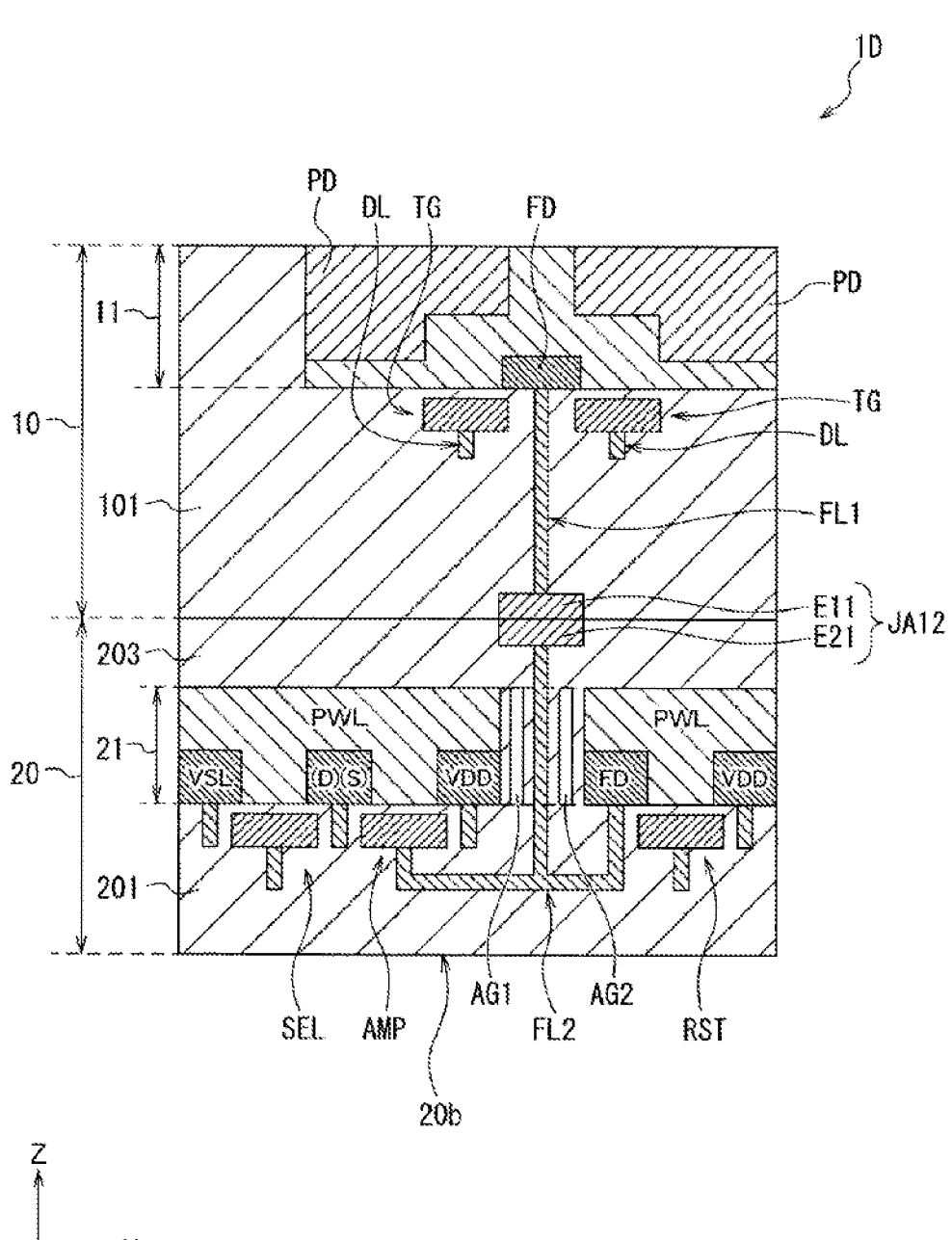
FIG. 14 is a cross-sectional view schematically illustrating a configuration of an imaging device according to a first modification of the third embodiment of the present disclosure.
Figure 15:
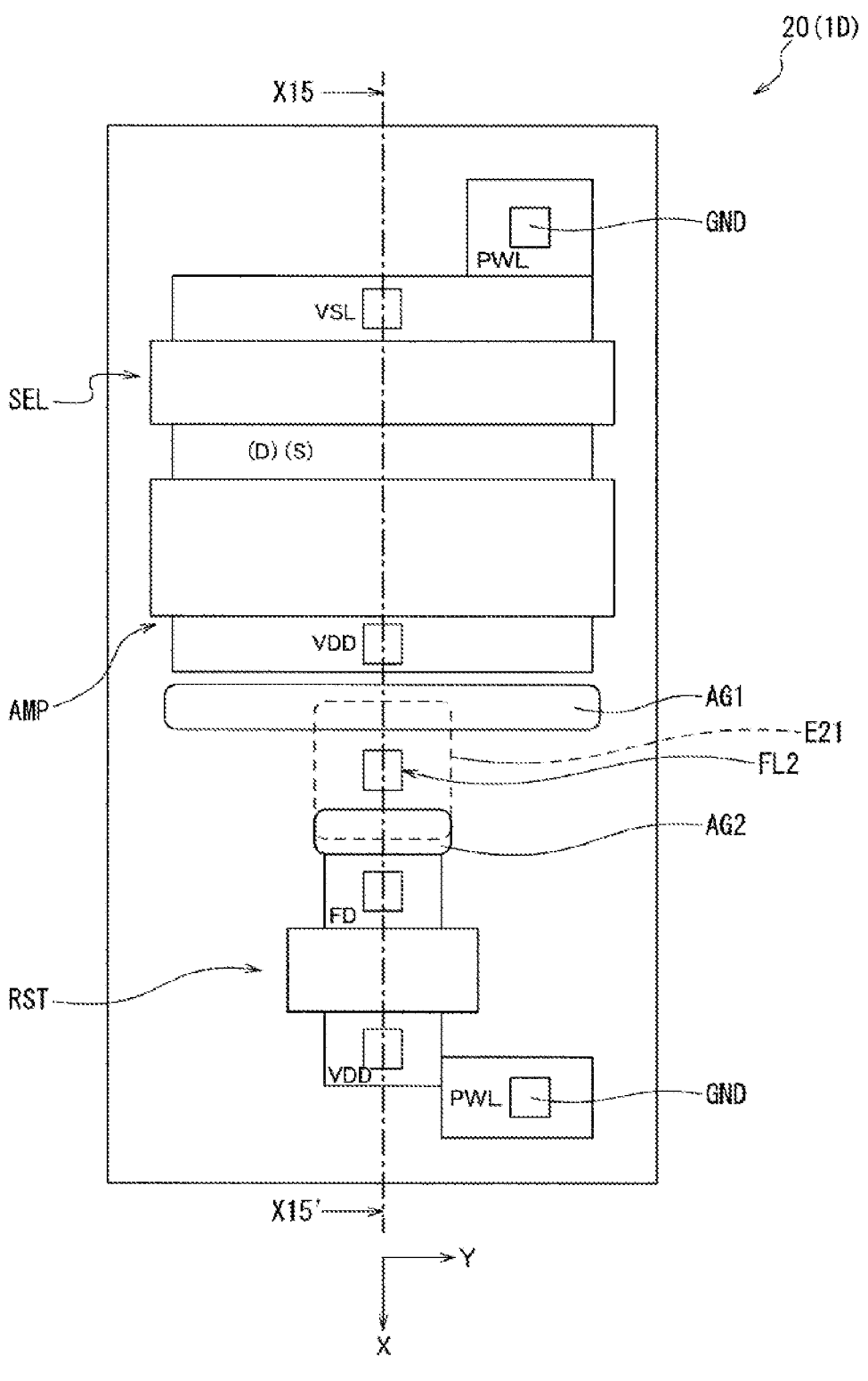
FIG. 15 is a plan view schematically illustrating a configuration of the second substrate portion in the imaging device according to the first modification of the third embodiment of the present disclosure.

FIG. 14 is a cross-sectional view schematically illustrating a configuration of an imaging device 1D according to a first modification of the third embodiment of the present disclosure. FIG. 15 is a plan view schematically illustrating a configuration of the second substrate portion 20 in the imaging device 1D according to the first modification of the third embodiment of the present disclosure. A cross section of the plan view of FIG. 15 taken along line X15-X15' corresponds to the cross section of the second substrate portion 20 illustrated in FIG. 14.

As illustrated in FIGS. 14 and 15, in the imaging device 1D, the amplification transistor AMP and the selection transistor SEL are connected in series without interposing a wiring line. The source region (S) of the amplification transistor AMP and the drain region (D) of the selection transistor SEL include the same N-type impurity diffusion layer. Furthermore, in the amplification transistor AMP, the high-potential drain region connected to the power supply line VDD is positioned on the through region R3 side.

In the imaging device 1D, the first air gap portion AG1 and the second air gap portion AG2 are formed longer in the thickness direction of the second semiconductor substrate 21 (for example, in the Z-axis direction) than those in the imaging device 1C (see FIG. 10). In the Z-axis direction, each of the length of the first air gap portion AG1 and the length of the second air gap portion AG2 are the same as or substantially the same as the thickness of the second semiconductor substrate 21. The first air gap portion AG1 is formed long in the Z-axis direction so as to cover not only the side surface of the well region PWL but also the side surface of the drain region of the amplification transistor AMP. Similarly, the second air gap portion AG2 is formed long in the Z-axis direction so as to cover not only the side surface of the well region PWL but also the side surface of the source region of the reset transistor RST.

In the imaging device 1D, the drain region of the amplification transistor AMP is positioned on the through region R3 side. Since there is a potential difference between the high-potential drain region connected to the power supply line VDD and the second wiring line FL2 connected to the floating diffusion FD, a capacitance is generated between the drain region and the second wiring line FL2. However, in the imaging device 1D, since the first air gap portion AG1 is arranged between the drain region and the second wiring line FL2, an increase in capacitance is suppressed. Therefore, the imaging device 1D can suppress a decrease in the conversion efficiency of the amplification transistor AMP.

Second Modification of Third Embodiment

Figure 16:
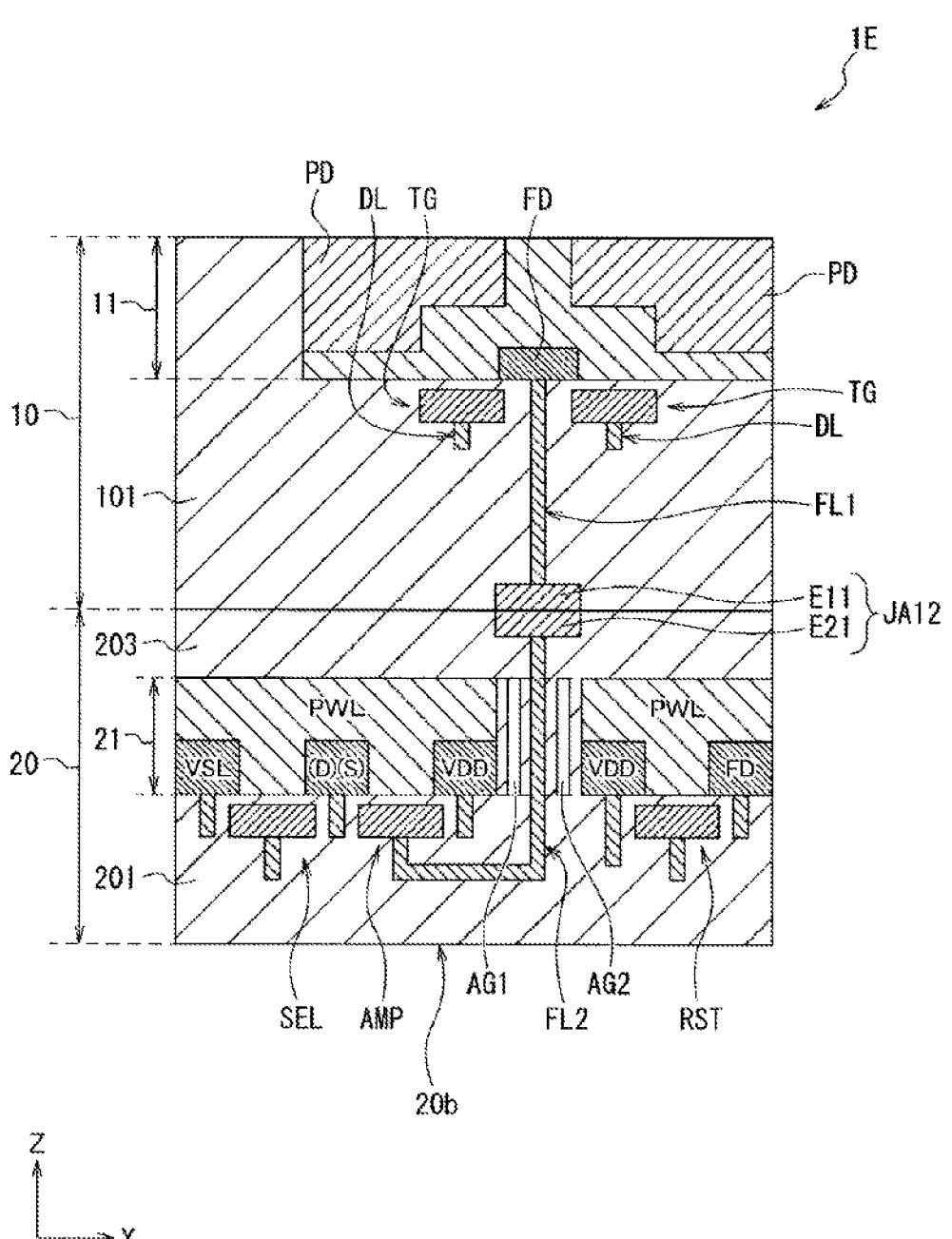
FIG. 16 is a cross-sectional view schematically illustrating a configuration of an imaging device according to a second modification of the third embodiment of the present disclosure.
Figure 17:
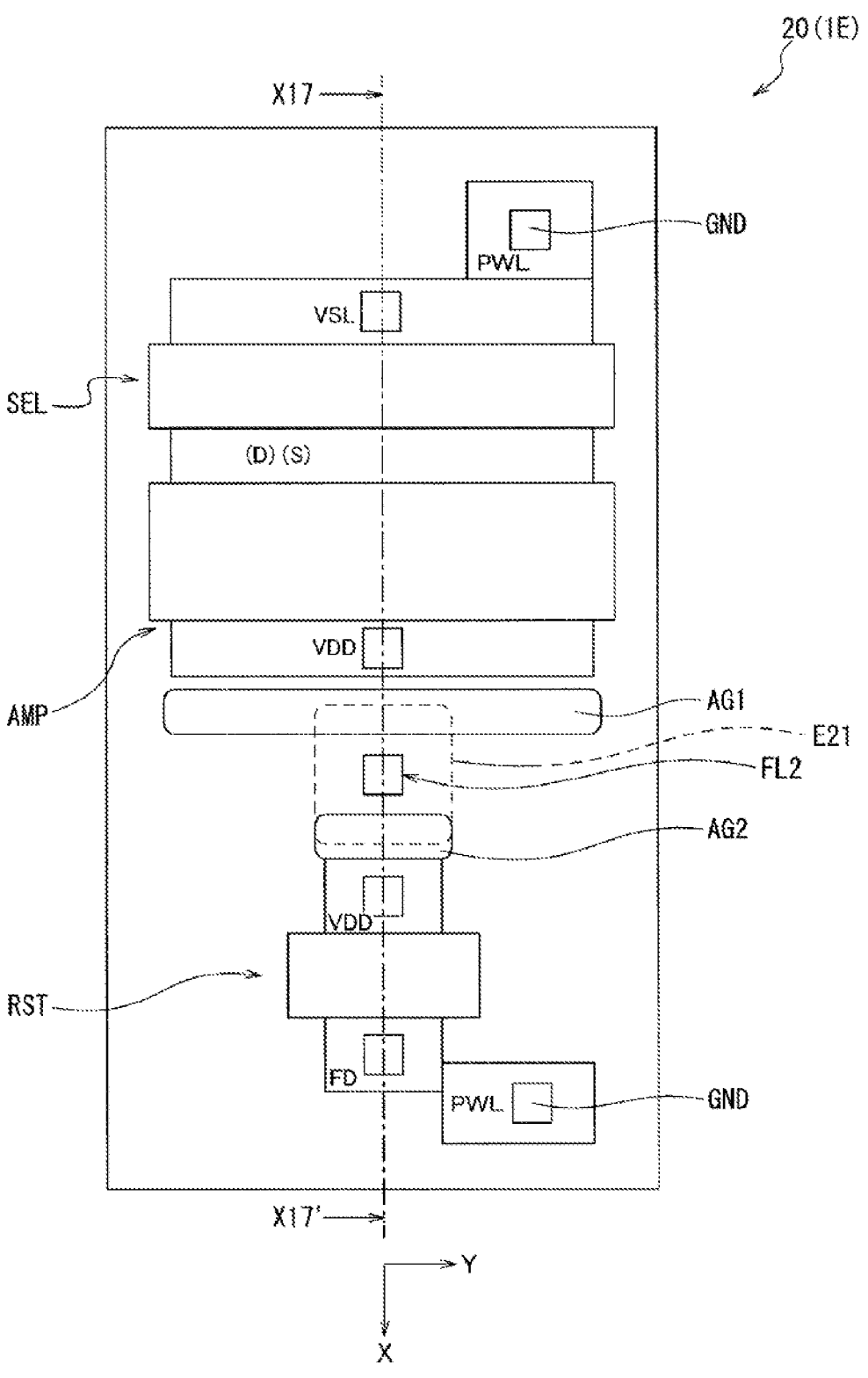
FIG. 17 is a plan view schematically illustrating a configuration of the second substrate portion in the imaging device according to the second modification of the third embodiment of the present disclosure.

FIG. 16 is a cross-sectional view schematically illustrating a configuration of an imaging device 1E according to a second modification of the third embodiment of the present disclosure. FIG. 17 is a plan view schematically illustrating a configuration of the second substrate portion 20 in the imaging device 1E according to the second modification of the third embodiment of the present disclosure. A cross section of the plan view of FIG. 17 taken along line X17-X17' corresponds to the cross section of the second substrate portion 20 illustrated in FIG. 16.

As illustrated in FIGS. 16 and 17, the drain region of the reset transistor RST is connected to the power supply line VDD and has a high potential. In the imaging device 1E, unlike the imaging device 1D (see FIG. 14), the drain region of the reset transistor RST is positioned on the through region R3 side. In the imaging device 1E, since there is a potential difference between the drain region of the reset transistor RST and the second wiring line FL2 connected to the floating diffusion FD, a capacitance is generated between the drain region of the reset transistor RST and the second wiring line FL2. However, in the imaging device 1E, since the second air gap portion AG2 is arranged between the drain region and the second wiring line FL2, an increase in capacitance is suppressed. Therefore, the imaging device 1E can suppress a decrease in the conversion efficiency of the amplification transistor AMP.

OTHER EMBODIMENTS

Although the present disclosure has been described above in the form of embodiments and modifications, the descriptions and drawings that constitute parts of this disclosure are not to be understood as limiting the present disclosure. Various alternative embodiments, examples, and operable techniques will become apparent from this disclosure to those skilled in the art. For example, the "through wiring line" of the present disclosure is not limited to the second wiring line FL2 connected to the floating diffusion FD. The "through wiring line" of the present disclosure may be another wiring line other than the second wiring line FL2. As described above, the present technology obviously includes various embodiments and the like that are not described herein. At least one of various omissions, replacements, or alterations of the components can be performed without departing from the gist of the embodiments and the respective modifications described above. Furthermore, the advantageous effects described in the present specification are merely exemplary and are not restrictive, and other advantageous effects may be produced.

Note that the present disclosure can also have the following configurations.

(1)

An imaging device including:

a first substrate portion; and a second substrate portion provided on one surface side of the first substrate portion, in which the first substrate portion includes:

a first semiconductor substrate;

a sensor pixel provided at the first semiconductor substrate, the sensor pixel configured to perform photoelectric conversion;

a first interlayer insulating film provided at the first semiconductor substrate on a side of a surface facing the second substrate portion; and a first electrode portion provided at the first interlayer insulating film on a side of a surface facing the second substrate portion, the second substrate portion includes:

a second semiconductor substrate;

a readout circuit provided at the second semiconductor substrate, the readout circuit configured to output a pixel signal based on a charge output from the sensor pixel;

a second interlayer insulating film provided at the second semiconductor substrate on a side of a surface facing the first substrate portion; and a second electrode portion provided at the second interlayer insulating film on a side of a surface facing the first substrate portion, the first electrode portion and the second electrode portion are directly joined to each other, the readout circuit includes an amplification transistor configured to amplify a signal of a voltage corresponding to a level of the charge output from the sensor pixel, the second semiconductor substrate includes:

a first element region in which the amplification transistor is provided;

a second element region in which another element other than the amplification transistor is provided; and a through region through which the second semiconductor substrate passes in a thickness direction, and the first element region and the second element region are isolated by the through region.

(2)

The imaging device according to the above-described (1), in which a source region of the amplification transistor and a well region of the amplification transistor are connected.

(3)

The imaging device according to the above-described (1) or (2), further including a third substrate portion provided at the second substrate portion on an opposite side of a surface facing the first substrate portion, in which the second substrate portion further includes:

a third interlayer insulating film provided at the second semiconductor substrate on a side of a surface facing the third substrate portion; and a third electrode portion provided at the third interlayer insulating film on a side of a surface facing the third substrate portion, the third substrate portion includes:

a third semiconductor substrate;

a logic circuit provided at the third semiconductor substrate, the logic circuit configured to process the pixel signal;

a fourth interlayer insulating film provided at the third semiconductor substrate on a side of a surface facing the second substrate portion; and a fourth electrode portion provided at the fourth interlayer insulating film on a side of a surface facing the second substrate portion, and the third electrode portion and the fourth electrode portion are directly joined to each other.

(4)

The imaging device according to any one of the above-described (1) to (3), in which the sensor pixel further includes:

a photoelectric conversion element;

a transfer transistor electrically connected to the photoelectric conversion element; and a floating diffusion configured to temporarily hold a charge output from the photoelectric conversion element via the transfer transistor, the readout circuit further includes:

a reset transistor configured to reset a potential of the floating diffusion to a predetermined potential; and a selection transistor configured to control an output timing of the pixel signal from the amplification transistor, the amplification transistor generates, as the pixel signal, a signal of a voltage corresponding to a level of a charge held in the floating diffusion, and the another element provided in the second element region includes the reset transistor.

(5)

The imaging device according to the above-described (4), in which the first substrate portion further includes a first wiring line connected to the floating diffusion, the second substrate portion further includes a second wiring line connected to a gate electrode of the amplification transistor, and the first wiring line and the second wiring line are connected to each other via the first electrode portion and the second electrode portion.

(6)

The imaging device according to any one of the above-described (1 to 5, in which the second substrate portion further includes:

an insulating isolation film provided in the through region; and a through wiring line passing through the insulating isolation film.

(7)

The imaging device according to the above-described (5), in which the second substrate portion further includes:

an insulating isolation film provided in the through region; and a through wiring line passing through the insulating isolation film, and a part of the second wiring line passes through the insulating isolation film as the through wiring line.

(8)

The imaging device according to the above-described (6) or (7), in which the second substrate portion further includes a first air gap portion provided at the insulating isolation film and positioned between the through wiring line and a side surface of the first element region.

(9)

The imaging device according to the above-described (8), in which the first air gap portion is positioned between the through wiring line and a well region of the amplification transistor.

(10)

The imaging device according to any one of the above-described (6) to (9), in which the second substrate portion further includes a second air gap portion provided at the insulating isolation film and positioned between the through wiring line and a side surface of the second element region.

(11)

The imaging device according to the above-described (4 or 5, in which the another element provided in the second element region includes the reset transistor, and the second substrate portion further includes:

an insulating isolation film provided in the through region;

a through wiring line passing through the insulating isolation film; and a second air gap portion provided at the insulating isolation film and positioned between the through wiring line and a well region of the reset transistor.

(12)

The imaging device according to the above-described (5), further including:

a pixel region; and a peripheral region positioned at a periphery of the pixel region, in which the first wiring line and the second wiring line are arranged in the pixel region.

(13)

The imaging device according to any one of the above-described (1) to (12), in which the sensor pixel further includes a MEM unit.

REFERENCE SIGNS LIST 1, 1A, 1B, 1C, 1D, 1E Imaging device
10, 10' First substrate portion
10'a Upper surface
11 First semiconductor substrate
12 Sensor pixel
17 MEM unit
19 Light-shielding portion
20, 20' Second substrate portion
20'a Upper surface
21 Second semiconductor substrate
21a Back surface
22 Circuit
30 Third substrate portion
30a Upper surface
31 Third semiconductor substrate
35 Logic circuit
36 Drive circuit
37 Comparator
38 Control circuit
101, 201, 203, 301 Interlayer insulating film
102 Insulating film
202 Insulating isolation film
AG1 First air gap portion
AG2 Second air gap portion
AMP Amplification transistor
AMP-G Gate electrode
CF Color filter D Drain region
DL Drive wiring line
E11, E21, E22, E31 Electrode portion
FD Floating diffusion
FL1 First wiring line
FL2 Second wiring line
GND Ground potential line
JA12, JA23, JB12, JB23 Electrode junction portion
LA1, LA2, LA3, LB1, LB2, LB3 Wiring line
M11, M12, M21 to M25, M31, M32, M33 Metal layer
ML Microlens
OFG Overflow transistor
PD Photodiode
PWL Well region
R1 First element region
R2 Second element region
R3 Through region
RA Pixel region
RB Peripheral region
RST Reset transistor
S Source region
SEL Selection transistor
TG Transfer transistor
MEM1 First memory transistor
MEM2 Second memory transistor
VDD Power supply line
VSL Vertical signal line
VSS Reference potential line
What is claimed is:

1. An imaging device, comprising:
a plurality of pixels,
wherein each pixel of the plurality of pixels comprises:
    a pixel region including a sensor pixel including a photoelectric conversion element;
    a peripheral region positioned at a periphery of the pixel region such as to exclude the sensor pixel from being provided within the peripheral region,
    a first substrate portion; and
    a second substrate portion provided on one surface side of the first substrate portion,
    wherein the first substrate portion comprises:
        a first semiconductor substrate;
        the sensor pixel provided at the first semiconductor substrate, the sensor pixel configured to perform photoelectric conversion;
        a first interlayer insulating film provided at the first semiconductor substrate on a side of a surface facing the second substrate portion; and
        a first electrode portion provided at the first interlayer insulating film on a side of a surface facing the second substrate portion,
    wherein the second substrate portion comprises:
        a second semiconductor substrate;
        a readout circuit provided at the second semiconductor substrate,
        wherein the readout circuit configured to output a pixel signal based on a charge output from the sensor pixel;
        a second interlayer insulating film provided at the second semiconductor substrate on a side of a surface facing the first substrate portion; and
        a second electrode portion provided at the second interlayer insulating film on a side of a surface facing the first substrate portion,
    wherein the first electrode portion and the second electrode portion are directly joined to each other,
    wherein the readout circuit comprises:

an amplification transistor configured to amplify a signal of a voltage corresponding to a level of the charge output from the sensor pixel,
wherein the second semiconductor substrate includes:
    a first element region in which the amplification transistor is provided;
    a second element region in which another element other than the amplification transistor is provided; and
    a through region through which the second semiconductor substrate passes in a thickness direction,
    wherein the first element region and the second element region are isolated by the through region, and
    wherein the amplification transistor is provided within the pixel region and the another element other than the amplification transistor is provided within the peripheral region in a cross-sectional view.

2. The imaging device according to claim 1, wherein a source region of the amplification transistor and a well region of the amplification transistor are connected.

3. The imaging device according to claim 1, further comprising:
a third substrate portion provided at the second substrate portion on an opposite side of a surface facing the first substrate portion,
wherein the second substrate portion further comprises:
    a third interlayer insulating film provided at the second semiconductor substrate on a side of a surface facing the third substrate portion; and
    a third electrode portion provided at the third interlayer insulating film on a side of a surface facing the third substrate portion,
wherein the third substrate portion comprises:
    a third semiconductor substrate;
    a logic circuit provided at the third semiconductor substrate, the logic circuit configured to process the pixel signal;
    a fourth interlayer insulating film provided at the third semiconductor substrate on a side of a surface facing the second substrate portion; and
    a fourth electrode portion provided at the fourth interlayer insulating film on a side of a surface facing the second substrate portion, and
wherein the third electrode portion and the fourth electrode portion are directly joined to each other.

4. The imaging device according to claim 1, wherein the sensor pixel further comprises:
a photoelectric conversion element;
a transfer transistor electrically connected to the photoelectric conversion element; and
a floating diffusion configured to temporarily hold a charge output from the photoelectric conversion element via the transfer transistor,
wherein the readout circuit further comprises:
    a reset transistor configured to reset a potential of the floating diffusion to a predetermined potential; and
    a selection transistor configured to control an output timing of the pixel signal from the amplification transistor,
wherein the amplification transistor generates, as the pixel signal, a signal of a voltage corresponding to a level of a charge held in the floating diffusion, and
wherein the another element provided in the second element region includes the reset transistor.

5. The imaging device according to claim 4, wherein the first substrate portion further comprises a first wiring line connected to the floating diffusion, wherein the second substrate portion further comprises a second wiring line connected to a gate electrode of the amplification transistor, and wherein the first wiring line and the second wiring line are connected to each other via the first electrode portion and the second electrode portion.

6. The imaging device according to claim 1, wherein the second substrate portion further comprises:

an insulating isolation film provided in the through region; and a through wiring line passing through the insulating isolation film.

7. The imaging device according to claim 5, wherein the second substrate portion further comprises:

an insulating isolation film provided in the through region; and a through wiring line passing through the insulating isolation film, and wherein a part of the second wiring line passes through the insulating isolation film as the through wiring line.

8. The imaging device according to claim 6, wherein the second substrate portion further comprises a first air gap portion provided at the insulating isolation film and positioned between the through wiring line and a side surface of the first element region.

9. The imaging device according to claim 8, wherein the first air gap portion is positioned between the through wiring line and a well region of the amplification transistor.

10. The imaging device according to claim 6, wherein the second substrate portion further comprises a second air gap portion provided at the insulating isolation film and positioned between the through wiring line and a side surface of the second element region.

11. The imaging device according to claim 4, wherein the another element provided in the second element region includes the reset transistor, and wherein the second substrate portion further comprises:

an insulating isolation film provided in the through region;

a through wiring line passing through the insulating isolation film; and a second air gap portion provided at the insulating isolation film and positioned between the through wiring line and a well region of the reset transistor.

12. The imaging device according to claim 5, wherein the first wiring line and the second wiring line are arranged in the pixel region.

13. The imaging device according to claim 1, wherein the sensor pixel further comprises a MEM unit.

14. The imaging device according to claim 1, further comprising a third substrate portion provided at the second substrate portion on an opposite side of a surface facing the first substrate portion.

15. The imaging device according to claim 14, wherein the third substrate portion comprises a third semiconductor substrate and a logic circuit provided at the third semiconductor substrate.

16. An imaging device, comprising:

a plurality of pixels, wherein each pixel of the plurality of pixels comprises:

a pixel region including a sensor pixel including a photoelectric conversion element;

a peripheral region positioned at a periphery of the pixel region such as to exclude the sensor pixel from being provided within the peripheral region;

a first substrate portion; and a second substrate portion provided on one surface side of the first substrate portion, wherein the first substrate portion comprises:

a first semiconductor substrate; and the sensor pixel provided at the first semiconductor substrate;

wherein the second substrate portion comprises:

a second semiconductor substrate; and a readout circuit provided at the second semiconductor substrate, wherein the readout circuit comprises an amplification transistor, wherein the second semiconductor substrate includes:

a first element region in which the amplification transistor is provided; and a second element region in which another element other than the amplification transistor is provided; and wherein the first element region and the second element region are isolated by a through region, and wherein the amplification transistor is provided within the pixel region and the another element other than the amplification transistor is provided within the peripheral region in a cross-sectional view.

17. The imaging device according to claim 16, wherein a source region of the amplification transistor and a well region of the amplification transistor are connected.

18. The imaging device according to claim 16, wherein the sensor pixel further comprises a MEM unit.

19. The imaging device according to claim 16, wherein the sensor pixel further comprises:

a photoelectric conversion element;

a transfer transistor electrically connected to the photoelectric conversion element; and a floating diffusion configured to temporarily hold a charge output from the photoelectric conversion element via the transfer transistor.

20. The imaging device according to claim 19, wherein the first substrate portion further comprises a first wiring line connected to the floating diffusion, and wherein the second substrate portion further comprises a second wiring line connected to a gate electrode of the amplification transistor.

* * * * *